(12) United States Patent
Asai et al.

(10) Patent No.: US 6,787,481 B2
(45) Date of Patent: Sep. 7, 2004

(54) METHOD FOR MANUFACTURING SEMICONDUCTOR DEVICE

(75) Inventors: Masayuki Asai, Tokyo (JP); Hisashi Nomura, Tokyo (JP); Sadayoshi Horii, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/375,131

(22) Filed: Feb. 28, 2003

(65) Prior Publication Data

US 2004/0009678 A1 Jan. 15, 2004

(30) Foreign Application Priority Data

Feb. 28, 2002 (JP) ........................................ 2002-053626
Dec. 24, 2002 (JP) ........................................ 2002-372910

(51) Int. Cl.[7] ........................ H01L 21/31; H01L 21/469
(52) U.S. Cl. ........................ 438/785; 438/681; 438/685; 438/778
(58) Field of Search ................................ 438/785, 680, 438/681, 685, 778, 795, 798

(56) References Cited

U.S. PATENT DOCUMENTS

| | | | | |
|---|---|---|---|---|
| 6,103,567 | A | * | 8/2000 | Shih et al. ................... 438/251 |
| 6,534,395 | B2 | * | 3/2003 | Werkhoven et al. ......... 438/627 |
| 6,602,784 | B2 | * | 8/2003 | Sneh ............................. 438/680 |
| 6,613,695 | B2 | * | 9/2003 | Pomarede et al. ........... 438/767 |
| 2002/0076946 | A1 | * | 6/2002 | Kim et al. .................... 438/785 |
| 2003/0013320 | A1 | * | 1/2003 | Kim et al. .................... 438/778 |

FOREIGN PATENT DOCUMENTS

| | | |
|---|---|---|
| JP | 5-221644 | 8/1993 |
| JP | 5-267567 | 10/1993 |
| JP | 9-82696 | 3/1997 |
| JP | 11-177057 | 7/1999 |
| JP | 11-217672 | 8/1999 |
| JP | 2001-24169 | 1/2001 |
| JP | 2002-50622 | 2/2002 |

* cited by examiner

Primary Examiner—Alexander Ghyka
(74) Attorney, Agent, or Firm—Oliff & Berridge, PLC

(57) ABSTRACT

A method for manufacturing a semiconductor device can efficiently form on a substrate an amorphous thin film containing small amounts of impurities without needs for a rapid annealing treatment and a frequent cleaning process. A method for manufacturing a semiconductor device comprises a film-forming step and a film-modifying step. In the film-forming step, a film formation gas from a film formation raw material supply unit 9 is supplied into a reaction chamber 1 through a shower head 6 to form an amorphous thin film including a hafnium oxide film ($HfO_2$ film) on a substrate 4 which is rotating. In the film-modifying step, a radical generated in a reactant activation unit 11 is supplied through the same shower head 6 as used for supplying the film formation gas, so as to remove a specific element which is an impurity in the film formed in the film-forming step. By a controller 25, the film-forming step and the film-modifying step are subsequently repeated two or more times in the same reaction chamber 1 so as to form a semiconductor device.

17 Claims, 18 Drawing Sheets

METHOD FOR MANUFACTURING SEMICONDUCTOR DEVICE

BACKGROUND OF THE INVENTION

1. Field of the Invention

This invention relates to a method for manufacturing a semiconductor device wherein a thin film is formed on a substrate.

2. Description of the Related Art

In semiconductor manufacturing processes, there is a CVD (Chemical Vapor Deposition) process in which a prescribed film formation process is performed on a surface of a substrate (a substrate to be processed which is based on a silicon wafer, a glass and the like, on which a fine electric circuit pattern is produced). In this CVD process, the substrate is loaded into a gas-tight reaction chamber, the substrate is heated by a heating means provided in the chamber, and a chemical reaction is allowed to occur while introducing a film formation gas on the substrate, to uniformly form a thin film on the fine electric circuit pattern provided on the substrate. In such a reaction chamber, the thin film is also formed on a structure besides the substrate. In a CVD apparatus as shown in FIG. 19, a shower head 6 and a susceptor 2 is provided in a reaction chamber 1, and a substrate 4 is disposed on the susceptor 2. A film formation gas is introduced into the reaction chamber 1 through a raw material supply tube 5 which is connected to the shower head 6, and supplied on the substrate 4 through a plurality of apertures 8 which are provided in the shower head 6. The gas which is supplied on the substrate 4 is subjected to an exhaust process through an exhaust tube 7. In addition, the substrate 4 is heated by a heater 3 which is provided below the susceptor 2.

As such a CVD apparatus, there is an ALD (Atomic Layer Deposition) apparatus or an MOCVD (Metal Organic Chemical Vapor Deposition) apparatus for forming an amorphous $HfO_2$ film or an amorphous Hf silicate film using an organic chemical material as a film formation raw material (the amorphous $HfO_2$ film and the amorphous Hf silicate film being hereinafter simply abbreviated as an HfO film). Here, the differences between the CVD method performed by the MOCVD apparatus and the ALD method performed by the ALD apparatus are as follows. The ALD method is performed at a low process temperature and under a low pressure to form a film by one atomic layer at a time. On the contrary, the CVD method is performed at a higher process temperature and under a higher pressure than those of the ALD method to form a film by approximately a ⅙ atomic layer to tens of atomic layers at a time.

The film formation raw material which includes:

$Hf[OC(CH_3)_3]_4$ (hereinafter abbreviated as Hf-(OtBu)$_4$);

$Hf[OC(CH_3)_2CH_2OCH_3]_4$ (hereinafter abbreviated as Hf-(MMP)$_4$) where MMP: methylmethoxypropoxy;

$Hf[O—Si—(CH_3)_3]_4$; and the like, is used.

In such materials, most organic materials, for example, Hf-(OtBu)$_4$ and Hf-(MMP)$_4$, are in a liquid phase at ordinary temperature and ordinary pressure. As a result, for example, Hf-(MMP)$_4$ is heated and changed into a gas due to a vapor pressure and is utilized. Utilizing such a raw material and using the above-described CVD method, an HfO film is formed, for example, at a substrate temperature of 450° C. or lower. This HfO film contains impurities such as CH, OH and the like, in large quantity, for example, in an amount of several percent (%), which result from the organic material. Consequently, as a classification indicating an electrical property of a substance, the HfO film belongs to a semiconductor or conductor which is contrary to the intention of ensuring an electrical insulator.

In order to ensure electrical insulation of such a thin film and stability of the film, conventionally, an attempt has been made to allow C and H to leave the HfO film so as to convert it into an densified stable insulator thin film, by performing on the HfO film a rapid annealing treatment (hereinafter abbreviated as an RTA (Rapid Thermal Annealing)) at a temperature of 650° C. to 800° C. in an atmosphere of $O_2$ or $N_2$. Here, an aim of the RTA is to allow the impurities such as C, H and the like, in a film to leave the film and is to densify the film. Although the densification is not performed up to crystallization, the densification is performed in order to allow a mean interatomic distance in an amorphous state to be shorter.

In FIG. 20, there is shown a cluster apparatus construction in a conventional method for forming an HfO film. A substrate is loaded into a load-lock chamber 32. In a first reaction chamber 33, a substrate surface treatment such as RCA cleaning (a typical cleaning method based on hydrogen peroxide) and the like, is performed. In a second reaction chamber 34, an HfO film according to a method corresponding to the above-described method is formed. In a third reaction chamber 35, an RTA treatment (an impurity removal, thermal annealing treatment) is performed. In a fourth reaction chamber 36, an electrode (for example, a poly-Si thin film and the like) is formed. The substrate on which the electrode is formed is unloaded from the load-lock chamber 32 to an outside of the apparatus. The above carrying-in and carrying-out are performed using a substrate transfer robot 31 provided in a substrate transfer chamber 30.

In the third chamber 35, when C and H are allowed to leave the HfO film by the RTA treatment, there arises a problem that a surface state of the HfO film loses evenness and changes into an uneven surface state. Further, the HfO film tends to partially crystallize by the RTA treatment so that a large current becomes apt to pass through a crystal grain boundary to cause a problem that the insulation and stability of the film are impaired, which is contrary to the intention. These problems which are not limited to an insulator are common to all thin film deposition methods which utilize an ALD method or an MOCVD method in which a organic chemical material is used.

Moreover, in the second reaction chamber 34, a thin film is also formed on a structure besides a substrate. This is referred to as an accumulated film in which a large quantity of C and H are also mixed. As a result, amounts of C and H leaving the accumulated film increase with increasing number of the processed substrates, and amounts of C and H mixed and contained in the HfO film gradually increase with increasing number of the processed substrates. Due to this phenomenon, it is very difficult to allow the quality of the continuously produced HfO films to be constant. Therefore, in order to solve the critical phenomenon, it becomes necessary to frequently practice a removal process of an accumulated film by self-cleaning, which becomes a factor that decreases productivity.

As stated above, in the conventional technique for forming an amorphous thin film, there are problems that the surface state of an HfO film loses evenness by an RTA treatment and changes into an uneven surface state, and that the HfO film partially crystallizes by the RTA treatment so as to allow a crystal grain boundary to occur so that the insulation and stability of the film are lowered.

Furthermore, in order to allow the quality of continuously produced HfO films to be constant, it is necessary to frequently practice a cleaning process of an accumulated film in which a large quantity of C and H are mixed. As a result, the productivity is reduced.

In addition, as a thin film formation technique, which does not relate to an HfO film, a method for repeating in a same reaction chamber a $Ta_2O_5$ film formation and a modification process two or more times (for example, refer to Patent Document 1), a method for repeating in a same reaction chamber a film formation process of a high dielectric constant oxide film and a ferroelectrics oxide film and a heat treatment with plasma generated by using an oxidative atmospheric gas two or more times (for example, refer to Patent Document 2), and a method for repeating a metal film formation process and a metal nitride film formation process by introducing a nitriding material gas two or more times (for example, refer to Patent Document 3) are known.

[Patent Document 1]

Japanese Patent Application Laid-Open No. 2002-50622

[Patent Document 2]

Japanese Patent Application Laid-Open No. 11-177057

[Patent Document 3]

Japanese Patent Application Laid-Open No. 11-217672

However, when a metal oxide film is formed using the conventional techniques described in the above-stated Patent Documents 1 to 3, the metal oxide film is formed using a gas containing an oxygen atom in addition to a raw material during the film-forming step so that a specific element in the metal oxide film can not be removed effectively during the film-modifying step thereby providing insufficient modification of the film.

Moreover, since the film formation gas and the reactant are supplied through different supply ports, foreign substances which adhere to the inside of the supply ports can not be restrained from falling down on the substrate, and even if cleaning is performed, the cleaning gas and by-products which are adsorbed onto the inside of the supply ports are removed insufficiently.

Furthermore, if a thin film is formed and annealed in one apparatus, subsequently taken out from the apparatus and provided with an electrode formed thereon in a different apparatus, the problem that a throughput is reduced is caused.

SUMMARY OF THE INVENTION

An object of the present invention is to provide a method for manufacturing a semiconductor device wherewith, by resolving the problems with the prior art noted in the foregoing, a specific element in a metal oxide film can be removed effectively during a film-modifying step. A further object of the present invention is to provide a method for manufacturing a semiconductor device wherewith foreign substances which adhere to an inside of supply ports can be restrained from falling down on a substrate, and a cleaning gas and by-products which are adsorbed onto the inside of the supply ports due to cleaning can be removed. A further object of the present invention is to provide a method for manufacturing a semiconductor device wherewith a specific element in a film containing Hf can be removed rapidly. A further object of the present invention is to provide a method for manufacturing a semiconductor device wherewith a throughput can be enhanced.

A first invention is a method for manufacturing a semiconductor device comprising the steps of: forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated two or more times. Since a metal oxide film is formed on a substrate without using a gas containing an oxygen atom except a raw material gas in a film-forming step, even though the raw material gas is used that is obtained by vaporizing a raw material containing an oxygen atom and a metal atom and being liable to allow a specific element to be contained in the film, the specific element in the film can be removed effectively so as to make the film easy to modify. In addition, since a film-forming step and a film-modifying step are repeated successively, a specific element in the film formed in the film-forming step can be removed rapidly so as to modify the film. Moreover, since a film-forming step and a film-modifying step are repeated successively two or more times, a film with a prescribed film thickness can be formed, and also a removed amount of a specific element in the formed film can be increased so as to modify the film sufficiently, in comparison with the case wherein a film with a prescribed film thickness is formed at a time, and then the film-modifying step is performed.

A second invention is a method for manufacturing a semiconductor device according to the first invention, wherein the film-forming step and the film-modifying step are performed in a same reaction chamber. When the film-forming step and the film-modifying step are performed in the same reaction chamber, a temperature drop of the substrate does not occur between the steps. As a result, a temperature raising time for processing the substrate again becomes unnecessary so that the temperature raising time of the substrate can be saved so as to provide good efficiency in processing. In addition, since the substrate remains in the same reaction chamber, the surface of the formed film becomes difficult to contaminate.

A third invention is a method for manufacturing a semiconductor device according to the first invention, wherein the metal atom is Hf, and the metal oxide film is a film containing Hf. In the case of using a raw material containing a metal atom as a raw material, a gas containing an oxygen atom such as an oxygen gas and the like is typically used along with the raw material. In particular, however, in the case that the metal atom is Hf and the metal oxide film is a film containing Hf, a specific element in the film which is formed without using a gas containing an oxygen atom rather than with using a gas containing an oxygen atom can be removed effectively so as to modify the film.

A fourth invention is a method for manufacturing a semiconductor device according to the first invention, wherein the raw material is $Hf[OC(CH_3)_2CH_2OCH_3]_4$, and the metal oxide film is a film containing Hf. In the case of using a organic raw material as a raw material, a gas containing an oxygen atom is typically used along with the raw material. In particular, however, in the case of using $Hf[OC(CH_3)_2CH_2OCH_3]_4$, a mixing amount of a specific element (an impurity) such as C, H or the like can be small without using a gas containing an oxygen atom rather than with using a gas containing an oxygen atom.

A fifth invention is a method for manufacturing a semiconductor device according to the first invention, wherein the metal atom is Hf, and the metal oxide film is a film containing Hf, and a film thickness of the metal oxide film which is formed in one film-forming step is 0.5 Å–30 Å. In the case that a film thickness of a film containing Hf which is formed in one film-forming step is 0.5 Å–30 Å (a ⅙ atomic layer to ten atomic layers), even though an impurity is contained in the film, it is possible to maintain a state of the film in which the film is difficult to crystallize, and performing the modification process in such a state can remove the impurity so as to make the film easy to modify.

A sixth invention is a method for manufacturing a semiconductor device according to the second invention, wherein the raw material gas supplied to the substrate in the film-forming step and the reactant supplied to the substrate in the film-modifying step are supplied through a same supply port. If the raw material gas supplied to the substrate in the film-forming step and the reactant supplied to the substrate in the film-modifying step are supplied through a same supply port, a metal oxide film can be deposited such that foreign substances which adhere to the inside of the supply port are covered with the deposited metal oxide film, so that the foreign substances can be restrained from falling down on the substrate. In addition, in the case that the reaction chamber is cleaned with a cleaning gas, the cleaning gas and by-products which are adsorbed onto the inside of the supply ports can be removed.

A seventh invention is a method for manufacturing a semiconductor device according to the second invention, wherein the raw material gas supplied to the substrate in the film-forming step and the reactant supplied to the substrate in the film-modifying step are supplied through different supply ports, respectively, wherein, when the raw material gas is supplied to the substrate through the supply port for the raw material gas in the film-forming step, a nonreactive gas is supplied to the supply port for the reactant, and wherein, when the reactant is supplied to the substrate through the supply port for the reactant in the film-modifying step, a nonreactive gas is supplied to the supply port for the raw material gas. Thus, the raw material gas and the reactant are supplied through different supply ports respectively, and a nonreactive gas such as an inert gas and the like is supplied in the respective steps through the supply port for one of the steps which is not involved in the currently performed step. This can also restrain the accumulated film from forming onto the inside of the supply ports.

An eighth invention is a method for manufacturing a semiconductor device according to the second invention, wherein, when the raw material gas is supplied to the substrate in the film-forming step, the reactant used in the film-modifying step is exhausted without stopping the supply of the reactant such that the reactant bypasses the reaction chamber, and wherein, when the reactant is supplied to the substrate in the film-modifying step, the raw material gas used in the film-forming step is exhausted without stopping the supply of the raw material gas such that the raw material gas bypasses the reaction chamber. In this way, if the reactant in the film-forming step and the film formation gas in the film-modifying step are kept flowing to bypass the reaction chamber without stopping their supply, the film formation gas or the reactant can be immediately supplied to the substrate only by allowing the flow bypassing the reaction chamber to switch from the bypassing state to the flowing state into the reaction chamber. As a result, a throughput can be enhanced.

A ninth invention is a method for manufacturing a semiconductor device according to the second invention, wherein an exhaust line for exhausting an interior of the reaction chamber in the film-forming step and an exhaust line for exhausting the interior of the reaction chamber in the film-modifying step are provided with a trap for use shared between both the steps. Since exhaust lines are provided with a trap, an entry of the raw material into an apparatus for removing hazardous materials and an exhaust pump in communication with the exhaust lines can be reduced, and a maintenance cycle of a substrate processing apparatus can be extended. In addition, since the trap is used in common between both the steps, the maintenance becomes simple.

A tenth invention is a method for manufacturing a semiconductor device according to the second invention, wherein the cleaning step is a step of removing a film which adheres to an inside of the reaction chamber using a cleaning gas which is activated by plasma, wherein the reactant used in the film-modifying step is a gas which is activated by plasma, and wherein a plasma source used for activating the gas in the film-modifying step and a plasma source used for activating the cleaning gas in the cleaning step are one plasma source shared with both the steps. Since one plasma source is shared with the reactant activation and the cleaning gas activation, control of the plasma source becomes easy and a semiconductor device can be manufactured at a low cost.

An eleventh invention is a method for manufacturing a semiconductor device according to the first invention, wherein the reactant contains an oxygen atom. If the reactant contains an oxygen atom, the film-modifying step of a specific element can be efficiently performed immediately after the metal oxide film formation.

A twelfth invention is a methods for manufacturing a semiconductor device according to the first invention, wherein the reactant comprises a gas obtained by activating a gas containing an oxygen atom. If the reactant is a gas obtained by activating a gas containing an oxygen atom by plasma, the film-modifying step of a specific element can be more efficiently performed immediately after the metal oxide film formation.

A thirteenth invention is a method for manufacturing a semiconductor device according to the first invention, wherein the film-forming step and/or the film-modifying step is performed while rotating the substrate. Since the step or steps are performed while rotating the substrate, a specific element in the film can be quickly removed uniformly so as to modify the film.

A fourteenth invention is a method for manufacturing a semiconductor device according to the second invention, further comprising the steps of: transferring the substrate from the reaction chamber via a transfer chamber to a different reaction chamber without exposing the substrate to an ambient atmosphere after forming the metal oxide film on the substrate by repeating the film-forming step and the film-modifying step, and forming in the different reaction chamber an electrode on the metal oxide film formed on the substrate, wherein, after forming the metal oxide film, the electrode is formed without performing an annealing step as a different step from the electrode formation step, and wherein the steps from the metal oxide film formation to the electrode formation are performed in a same apparatus. Since the steps from the metal oxide film formation to the electrode formation are performed in a same apparatus, the temperature raising time of the substrate can be saved in comparison with the case wherein the electrode formation is performed in a different apparatus. Moreover, the electrode can be formed on the film surface which remains in a clean state. Furthermore, since the metal oxide film is densified by thermal annealing performed when forming the electrode, the film becomes difficult to contaminate.

A fifteenth invention is a method for manufacturing a semiconductor device comprising the steps of: forming a thin film on a substrate by supplying a film formation gas to the substrate; and modifying the thin film which is formed in the film-forming step, by supplying a reactant which is different from said film formation gas, wherein the film-forming step and the film-modifying step are successively repeated in a same reaction chamber two or more times, and wherein the film formation gas supplied to the substrate in said film-forming step and the reactant supplied to the substrate in said film-modifying step are supplied through a same supply port. Since a film-forming step and a film-modifying step are repeated successively, a specific element in the film formed in the film-forming step can be removed rapidly so as to modify the film. In addition, since a film-forming step and a film-modifying step are repeated successively two or more times, a film with a prescribed film thickness can be formed, and also a removed amount of a specific element in the formed film can be increased so as to modify the film sufficiently, in comparison with the case wherein a film with a prescribed film thickness is formed at a time, and then the film-modifying step is performed. Moreover, if the raw material gas supplied to the substrate in the film-forming step and the reactant supplied to the substrate in the film-modifying step are supplied through a same supply port, a thin film can be deposited such that foreign substances which adhere to the inside of the supply port are covered with the deposited thin film, so that the foreign substances can be restrained from falling down on the substrate. Furthermore, in the case that the reaction chamber is cleaned with a cleaning gas, the cleaning gas and by-products which are adsorbed onto the inside of the supply ports can be removed.

A sixteenth invention is a method for manufacturing a semiconductor device comprising the steps of: forming a film containing Hf on a substrate using a raw material gas obtained by vaporizing a raw material containing Hf; and modifying the film containing Hf which is formed in the film-forming step, using a reactant which is different from said raw material gas, wherein the film-forming step and the film-modifying step are successively repeated two or more times. Since a film-forming step and a film-modifying step are repeated successively, a specific element in the film containing Hf formed in the film-forming step can be removed rapidly so as to modify the film. In addition, since a film-forming step and a film-modifying step are repeated successively two or more times, a film containing Hf with a prescribed film thickness can be formed, and also a removed amount of a specific element in the formed film can be increased so as to modify the film containing Hf sufficiently, in comparison with the case wherein a film containing Hf with a prescribed film thickness is formed at a time, and then the film-modifying step is performed.

A seventeenth invention is a method for manufacturing a semiconductor device according to the sixteenth invention, wherein a film thickness of the film containing Hf which is formed in one film-forming step is 0.5 Å–30 Å. In the case that a film thickness of a film containing Hf which is formed in one film-forming step is 0.5 Å–30 Å, namely, a ⅙ atomic layer to ten atomic layers, even though an impurity exists in the film, it is possible to maintain a state of the film in which the film is difficult to crystallize, and performing the modification process in such a state can remove the impurity so as to make the film easy to modify.

An eighteenth invention is A method for manufacturing a semiconductor device comprising the steps of: forming a thin film on a substrate by supplying a film formation gas to the substrate; modifying the thin film which is formed in the film-forming step, by supplying a reactant which is different from said film formation gas; transferring the substrate from the reaction chamber via a transfer chamber to a different reaction chamber without exposing the substrate to an ambient atmosphere; and forming in the different reaction chamber an electrode on the thin film formed on the substrate, wherein, after forming a thin film on the substrate by successively repeating in a same reaction chamber the film-forming step and the film-modifying step two or more times, the substrate transfer step and the electrode formation step are performed, and wherein, after forming the thin film by repeating the film-forming step and the film-modifying step two or more times, the electrode is formed without performing an annealing step as a different step from the electrode formation step, and wherein the steps from the thin film formation to the electrode formation are performed in a same apparatus. Since the steps from the thin film formation to the thin film modification and the electrode formation are performed in a same apparatus, the temperature raising time of the substrate can be saved in comparison with the case wherein the thin film modification or the electrode formation is performed in a different apparatus. Moreover, a specific element in the film can be removed rapidly so as to modify the film, and the electrode can be formed on the thin film surface which remains in a clean state. Furthermore, since the thin film is densified by thermal annealing performed when forming the electrode, the thin film becomes difficult to contaminate.

A nineteenth invention is a substrate processing apparatus comprising: a reaction chamber in which a substrate is processed; a first supply port through which a raw material gas is supplied into the reaction chamber, the raw material gas being obtained by vaporizing a raw material containing an oxygen atom and a metal atom; a second supply port through which a reactant is supplied into the reaction chamber, the reactant being different from the raw material gas; an exhaust port through which an inside of the reaction chamber is exhausted; and a controller for controlling a film-forming step and a film-modifying step such that the film-forming step and the film-modifying step are successively repeated two or more times, wherein the film-forming step is a step of forming in the reaction chamber a metal oxide film on a substrate without using a gas containing an oxygen atom except the raw material gas, and wherein the film-modifying step is a step of modifying the metal oxide film which is formed in the film-forming step, using the reactant which is different from the raw material gas. Since a substrate processing apparatus comprises a controller for controlling a film-forming step and a film-modifying step such that the film-forming step and the film-modifying step are successively repeated two or more times, the above-stated method for manufacturing a semiconductor device can be easily performed using the substrate processing apparatus.

In the first invention, the second invention, the sixth invention to the fifteenth invention, the eighteenth invention and the nineteenth invention, as stated above, the film which is formed in the film-forming step is not limited to a film containing Hf. On the other hand, in the third invention to the fifth invention, the sixteenth invention and the seventh invention, the film which is formed in the film-forming step is limited to a film containing Hf. Examples of the films containing Hf are $HfO_2$, HfON, HfSiO, HfSiON, HfAlO and HfAlON. In addition, examples of the films except the films containing Hf are as follows:

TaO film (tantalum oxide film) using PET(Ta(OC$_2$H$_5$)$_5$),

ZrO film (zirconium oxide film) using Zr-(MMP)$_4$,

AlO film (aluminum oxide film) using Al-(MMP)$_3$,

ZrSiO film (Zr oxide silicate film) and ZrSiON film (Zr oxynitride silicate film) using Zr-(MMP)$_4$ and Si-(MMP)$_4$, ZrAlO and ZrAlON films using Zr-(MMP)$_4$ and Al-(MMP)$_3$, TiO film (titanium oxide film) using Ti-(MMP)$_4$, TiSiO and TiSiON films using Ti-(MMP)$_4$ and Si-(MMP)$_4$, and TiAlO and TiAlON films using Ti-(MMP)$_4$ and Al-(MMP)$_3$.

DESCRIPTION OF THE PREFERRED EMBODIMENTS

An embodiment of the present invention will be explained below. In the embodiment, the case that an HfO film, in particular, an HfO$_2$ film in an amorphous state (hereinafter simply abbreviated as an HfO$_2$ film) is formed using the CVD method, more specifically, the MOCVD method, will be explained.

Figure 1:
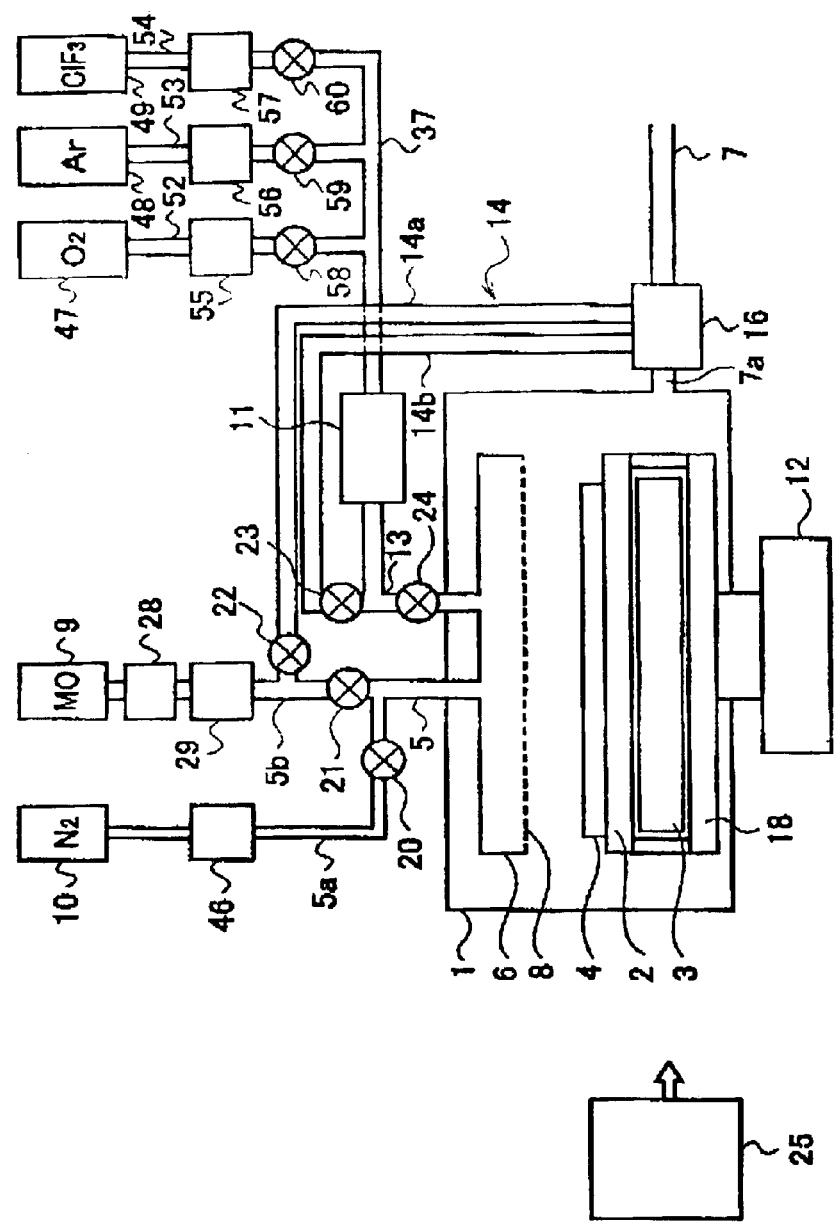
FIG. 1 is an explanatory schematic view of a reaction chamber in an embodiment.
Figure 19:
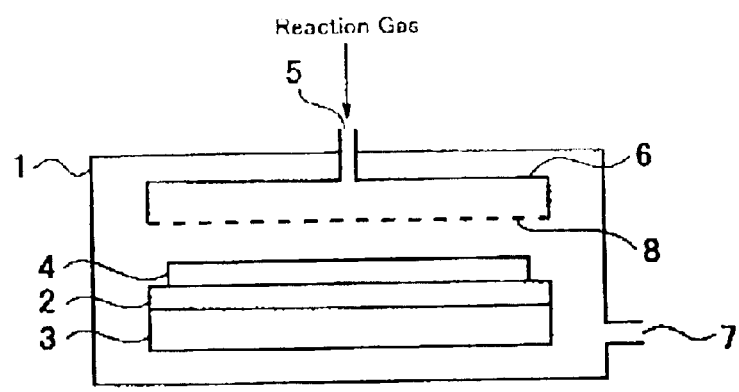
FIG. 19 is an explanatory conceptual view for showing a CVD reaction chamber in a conventional example.

FIG. 1 is a schematic view for showing an example of a single-substrate processing CVD apparatus which is a substrate processing apparatus according to an embodiment. A reactant activation unit 11 which is a plasma source, a substrate rotation unit 12, an inert gas supply unit 10 and a bypass tube 14 are added to a conventional reaction chamber 1 (FIG. 19).

As shown in the drawing, a hollow heater unit 18 covered with a susceptor 2 at an upper opening is provided in the reaction chamber 1. A heater 3 which is provided inside of the heater unit 18 is adapted to heat a substrate 4 which is located on the susceptor 2. The substrate located on the susceptor 4 is, for example, a semiconductor silicon wafer, a glass and the like.

The substrate rotation unit 12 which is provided outside of the reaction chamber 1 is adapted to rotate the heater unit 18 in the reaction chamber 1 so that the substrate 4 on the susceptor can be rotated. The purpose of the rotation of the substrate 4 is to quickly perform a treatments on the substrate in the substrate surface uniformly in a film-forming step and a film-modifying step which will be explained below.

In addition, a shower head 6 having many holes 8 is provided above the susceptor 2 in the reaction chamber 1. This shower head 6 is adapted to be connected in common to a raw material supply tube 5 through which a film formation gas is supplied and a radical supply tube 13 through which a radical is supplied, so that the film formation gas or the radical can be injected like a shower into the reaction chamber 1 from the shower head 6. Here, the shower head 6 constructs the same supply port through which the film formation gas supplied to the substrate 4 in the film-forming step and the radical supplied to the substrate 4 in the film-modifying step are supplied respectively.

A film formation raw material supply unit 9 for supplying a liquid organic raw material as a film formation raw material, a liquid flow rate controller 28 as a flow rate control means for controlling a liquid supply flow rate of the film formation raw material and a vaporizer 29 for vaporizing the film formation raw material are provided outside of the reaction chamber 1. An inert gas supply unit 10 for supplying an inert gas as a nonreactive gas and a mass flow controller 46 as a flow rate control means for controlling a supply flow rate of the inert gas are provided. An organic material such as Hf-(MMP)$_4$ and the like is used as the film formation raw material. In addition, Ar, He, N$_2$ or the like is used as the inert gas. A raw material gas supply tube 5b provided on the film formation raw material supply unit 9 and an inert gas supply tube 5a provided on the inert gas supply unit 10 are combined to be one tube which is the raw material supply tube 5 connected to the shower head 6. The raw material supply tube 5 is adapted to supply a mixed gas of the film formation gas and the inert gas to the shower head 6 in the film-forming step of forming an $HfO_2$ film on the substrate 4. Valves 21 and 20 which are provided on the raw material gas supply tube 5b and the inert gas supply tube 5a, respectively, are adapted to be opened or closed so that the supply of the mixed gas of the film formation gas and the inert gas can be controlled.

In addition, the reactant activation unit (remote plasma unit) 11 is provided outside of the reaction chamber 1, that is a plasma source for activating a gas by plasma to form a radical as a reactant. In the case of using an organic material such as Hf-$(MMP)_4$ and the like as a raw material, a radical used in the film-modifying step is preferably, for example, an oxygen radical. This is because an impurity removal treatment of C, H and the like can be efficiently performed by the oxygen radical immediately after $HfO_2$ film formation. Moreover, a radical used in a cleaning step is preferably, a $ClF_3$ radical. A process of oxidizing a film in an oxygen radical atmosphere obtained by decomposition of an oxygen-containing gas ($O_2$, $N_2O$, NO and the like) by plasma in the film-modifying step is referred to as a remote plasma oxidation process (RPO process).

A gas supply tube 37 is provided at an upstream side of the reactant activation unit 11. This gas supply tube 37 to which an oxygen supply unit 47 for supplying an oxygen ($O_2$), an Ar supply unit 48 for supplying an argon (Ar), namely, a gas for generating plasma and a $ClF_3$ supply unit 49 for supplying a chlorine fluoride ($ClF_3$) are connected via supply tubes 52, 53 and 54, is adapted to supply $O_2$ and Ar used in the film-modifying step and $ClF_3$ used in the cleaning step to the reactant activation unit 11. The oxygen supply unit 47, the Ar supply unit 48 and the $ClF_3$ supply unit 49 are provided with mass flow controllers 55, 56 and 57, respectively, which are flow rate control means for controlling the supply flow rate of the respective gases. Valves 58, 59 and 60 which are provided on the supply tubes 52, 53 and 54, respectively, are adapted to be opened or closed so that the supply of $O_2$ gas, Ar gas and $ClF_3$ can be controlled.

A radical supply tube 13 connected to the shower head 6, which is provided at a downstream side of the reactant activation unit 11, is adapted to supply an oxygen radical or a chlorine fluoride radical to the shower head 6 in the film-modifying step or the cleaning step. In addition, a valve 24 which is provided on the radical supply tube 13 is adapted to be opened or closed so that the supply of the radical can be controlled.

An exhaust port 7a which is provided on the reaction chamber 1 is connected to an exhaust tube 7 in communication with an apparatus for removing hazardous materials (not shown). The exhaust tube 7 is provided with a raw material recovery trap 16 for recovering the film formation raw material. This raw material recovery trap 16 is used in common between the film-forming step and the film-modifying step. The exhaust port 7a and the exhaust tube 7 comprise an exhaust line.

In addition, the raw material supply tube 5b and the radical supply tube 13 are provided with a raw material gas bypass tube 14a and a radical bypass tube 14b, respectively, (sometimes these are simply referred to as a bypass tube 14) which are connected to the raw material recovery trap 16 provided on the exhaust tube 7. The raw material gas bypass tube 14a and the radical bypass tube 14b are provided with valves 22 and 23, respectively. When the film formation gas is supplied to the substrate 4 in the reaction chamber 1 in the film-forming step, the radical used in the film-modifying step is exhausted by opening or closing these valves via the radical bypass tube 14b and the raw material recovery trap 16 without stopping the supply of the radical such that the radical bypasses the reaction chamber 1. Moreover, when the radical is supplied to the substrate 4 in the film-modifying step, the film formation gas used in the film-forming step is exhausted via the raw material gas bypass tube 14a and the raw material recovery trap 16 without stopping the supply of the film formation gas such that the film formation gas bypasses the reaction chamber 1.

Then, there is provided a controller 25 for controlling the opening, closing and the like of the above-stated valves 20 to 24 to thereby control the film-forming step of forming an $HfO_2$ film on the substrate 4 in the reaction chamber 1 and the film-modifying step of removing an impurity such C, H and the like which is a specific element in the $HfO_2$ film formed in the film-forming step, by a plasma treatment using the reactant activation unit 11, such that the film-forming step and the film-modifying step are successively repeated two or more times.

Next, a procedure for depositing a high quality $HfO_2$ film using the single-substrate processing CVD apparatus as stated above and shown in FIG. 1, which is different from the prior art, will be explained. This procedure includes a temperature raise step, a film-forming step, a purge step and a film-modifying step.

Firstly, while the substrate 4 which is located on the susceptor 2 in the reaction chamber 1 as shown in FIG. 1 is rotated by the substrate rotation unit 12, the heater 3 is supplied with electric power to uniformly heat the temperature of the substrate 4 to 350–500° C. (the temperature raise step). In addition, the substrate temperature which varies according to reactivity of the organic material to be used, is preferably in the range of 390 to 450° C. for Hf-$(MMP)_4$. Moreover, when transferring or heating the substrate 4, the valve 20 provided on the inert gas supply tube 5a is opened to allow the inert gas such as Ar, He, $N_2$ or the like to always flow so that particles and metal contaminants can be prevented from adhering to the substrate 4.

After completing the temperature raise step, the film-forming step is started. In the film-forming step, the liquid organic raw material, for example, Hf-$(MMP)_4$ which is supplied from the film formation raw material supply unit 9 is supplied by controlling the flow rate thereof with the liquid flow rate controller 28 to the vaporizer 29 to vaporize the raw material. By opening the valve 21 provided on the raw material gas supply tube 5b, the vaporized raw material gas is supplied to the substrate 4 via the shower head 6. At this time, the valve 20 is also kept opened to allow the inert gas (such as $N_2$ or the like) to always flow from the inert gas supply unit 10 to agitate the film formation gas. When diluted with the inert gas, the film formation gas becomes easy to agitate. The film formation gas supplied from the raw material gas supply tube 5b and the inert gas supplied from the inert gas supply tube 5a are mixed in the raw material supply tube 5 to be introduced into the shower head 6 as a mixed gas thereby being supplied onto the substrate 4 on the susceptor 2 like a shower by way of the many holes 8. In addition, at this time, only the Hf-$(MMP)_4$ gas is supplied as a reactive gas without supplying a gas containing an oxygen atom such as $O_2$ and the like.

By performing the supply of this mixed gas for a prescribed period of time, the $HfO_2$ film as an interface layer (a first insulation layer) to the substrate is formed on the substrate 4 to be 0.5 Å–30 Å thick, for example, 15 Å thick. During this time, since the substrate 4 is kept at a prescribed temperature (film formation temperature) by the heater 3 while rotating the substrate 4, a uniform film is formed in the whole substrate surface. Then, the valve 21 provided on the raw material gas supply tube 5b is closed to stop the supply of the raw material gas to the substrate 4. In this case, the valve 22 provided on the raw material gas bypass tube 14a is opened to allow the film formation gas to bypass the reaction chamber 1 via the raw material gas bypass tube 14a to be exhausted so that the supply of the film formation gas from the film formation raw material supply unit 9 is not stopped. Since it takes time to vaporize the liquid raw material until the vaporized raw material gas is stably supplied, if the film formation gas is kept flowing to bypass the reaction chamber 1 without stopping the supply of the film formation gas, the film formation gas can be immediately supplied to the substrate 4 only by allowing the flow to switch from the bypassing state to the flowing state into the reaction chamber 1, in the next film-forming step.

After completing the film-forming step, the purge step is started. In the purge step, the inside of the reaction chamber 1 is purged by an inert gas to remove the residual gas. In addition, since the valve 20 remains open and the inert gas (such as $N_2$ or the like) always flows into the reaction chamber 1 from the inert gas supply unit 10 in the film-forming step, the purge is performed the moment the valve 21 is closed to stop the supply of the raw material gas to the substrate 4.

After completing the purge step, the film-modifying step is started. The film-modifying step is performed by a RPO (remote plasma oxidation) process. Here, the RPO process means a remote plasma oxidation process of oxidizing a film using an oxygen radical as a reactant generated by activating an oxygen-containing gas ($O_2$, $N_2O$, NO and the like) by plasma. In the film-modifying step, the valve 59 provided on the supply tube 53 is opened, and Ar supplied from the Ar supply unit 48 is supplied by controlling the flow rate thereof with the mass flow controller 56 to the reactant activation unit 11 to generate Ar plasma. After generating Ar plasma, the valve 58 provided on the supply tube 52 is opened, and $O_2$ supplied from the oxygen supply unit 47 is supplied by controlling the flow rate thereof with the mass flow controller 55 to the reactant activation unit 11 which is generating Ar plasma to activate $O_2$. This generates an oxygen radical. The valve 24 provided on the radical supply tube 13 is opened to supply the gas containing the oxygen radical from the reactant activation unit 11 via the shower head 6 onto the substrate 4. During this time, since the substrate 4 is kept at a prescribed temperature (the same temperature as the film formation temperature) by the heater 3 while rotating the substrate 4, an impurity such as C, H and the like can be quickly removed uniformly from the 15 Å thick $HfO_2$ film formed on the substrate 4 in the film-forming step.

Then, the valve 24 provided on the radical supply tube 13 is closed to stop the supply of the oxygen radical to the substrate 4. Moreover, in this case, by opening the valve 23 provided on the radical bypass tube 14b, the gas containing the oxygen radical is allowed to bypass the reaction chamber 1 via the radical bypass tube 14b to be exhausted so that the supply of the oxygen radical is not stopped. Since it takes time to generate the oxygen radical until the oxygen radical is stably supplied, if the oxygen radical is kept flowing to bypass the reaction chamber 1 without stopping the supply of the oxygen radical, the radical can be immediately supplied to the substrate 4 only by allowing the flow to switch from the bypassing state to the flowing state into the reaction chamber 1, in the next film-modifying step.

After completing the film-modifying step, the purge step is started again. In the purge step, the inside of the reaction chamber 1 is purged by an inert gas to remove the residual gas. In addition, since the valve 20 remains open and the inert gas (such as $N_2$ or the like) always flows into the reaction chamber 1 from the inert gas supply unit 10 also in the film-modifying step, the purge is performed the moment the supply of the oxygen radical to the substrate 4 is stopped.

After completing the purge step, the film-modifying step is started again, and the valve 22 provided on the raw material gas bypass tube 14a is closed and the valve 21 provided on the raw material gas supply tube 5b is opened to supply the film formation gas to the substrate 4 via the shower head 6 so that the 15 Å thick $HfO_2$ film is also deposited on the film formed in the previous film-forming step.

By the cycle process of repeating: the film-forming step→the purge step→the film-modifying step→the purge step, as stated above, two or more times, a film with a prescribed film thickness having extremely small mixing amounts of CH and OH therein can be formed.

Here, the preferable film formation conditions for the case of using Hf-(MMP)$_4$ are as follows. The temperature range is 400–450° C., and the pressure range is in the order of 100 Pa or lower. With regard to the temperature, when the temperature is lower than 400° C., the amounts of the impurities (C, H) incorporated into the film becomes suddenly large. When the temperature is 400° C. or higher, the impurities become likely to leave the film so that the amounts of the impurities incorporated into the film are decreased. Moreover, when the temperature is higher than 450° C., step coverage becomes bad. However, when the temperature is 450° C. or lower, good step coverage is obtained, and an amorphous state is also maintained.

Furthermore, with regard to the pressure, when the pressure is, for example, 1 Torr (133 Pa) or higher, the gas becomes a viscous flow so that the gas can not reach the deep portion of a pattern channel. However, when the pressure is in the order of 100 Pa or lower, the gas can become a molecular flow so that the gas reaches the deep portion of a pattern channel.

Moreover, the preferable conditions of the RPO (remote plasma oxidation) process which is the film-modifying step performed successively following the film-forming step using Hf-(MMP)$_4$, are the temperature range of about 390–450° C. (approximately the same temperature as the film formation temperature) and the pressure range of about 100–1000 Pa. In addition, the $O_2$ flow rate for the radical is 100 sccm and the inert gas Ar flow rate is 1 slm.

The film-forming step and the film-modifying step are preferably performed at approximately the same temperature (the setting temperature of a heater is preferably constant without change thereof). This is because, by preventing temperature fluctuation from occurring, the tendency of particles to be generated due to the thermal expansion of peripheral members such as a shower head, a susceptor or the like, is reduced, and metals can be restrained from jumping out of metal parts (namely, metal contamination can be restricted).

In addition, in order to practice a self-cleaning step of an accumulated film by a cleaning gas radical, a cleaning gas (such as $Cl_2$, $ClF_3$ or the like) is converted to a radical in the reactant activation unit 11 to be introduced into the reaction chamber 1. This self-cleaning allows the cleaning gas to react with the accumulated film in the reaction chamber 1 so that the accumulated film is converted to metal chloride and the like, which is vaporized and exhausted. Thereby, the accumulated film in the reaction chamber is removed.

According to the embodiment as stated above, since the cycle process of repeating: the $HfO_2$ film formation→the modification process (RPO process)→the $HfO_2$ film formation→ - - - , two or more times, is performed, the $HfO_2$ film with a prescribed film thickness having extremely small mixing amounts of CH and OH therein can be formed. This will be explained specifically from the following viewpoints.

(1) Nonuse of $O_2$ during the film formation;
(2) The RPO process;
(3) The cycle process;
(4) A rotation mechanism;
(5) Sharing of a shower head;
(6) A bypass tube;
(7) Sharing of a trap;
(8) Use of a plasma source;
(9) Processes performed in the same apparatus; and
(10) Modified examples.

(1) Nonuse of $O_2$ During the Film Formation

If a gas containing an oxygen atom such as oxygen ($O_2$) and the like except a raw material gas is not used during film formation of the $HfO_2$ film in the film-forming step, mixing amounts of CH and OH in the film can be reduced.

There is a case where $O_2$ is mixed into a mixed gas of a raw material gas and an inert gas when forming an $HfO_2$ film. This is because, considering a film formation rate and adhesion to a base, it is generally better to supply $O_2$ along with a raw material gas. With regard to Hf-$(MMP)_4$, the inventors however have found that, by their experiments, no supply Of $O_2$ makes the mixing amounts of impurities in the film decreased to increase the film quality while, on the contrary, supply of $O_2$ makes the mixing amounts of impurities in the film increased to decrease the film quality. As a result, in the embodiment using Hf-$(MMP)_4$ as a film formation raw material, $O_2$ is not mixed because mixing amounts of CH and OH in the film can be reduced when mixing no $O_2$.

A mechanism in which no supply of oxygen can make mixing amounts of impurities in the film reduced in the case of using Hf-$(MMP)_4$, is as follows. Below is a comparison of ideal chemical reaction formulae between the case of mixing oxygen in the use of Hf-$(MMP)_4$ (hereinafter sometimes referred to as presence of oxygen) and the case of mixing no oxygen in the use of Hf-$(MMP)_4$ (hereinafter sometimes referred to as absence of oxygen).

A. The Case Where an Ideal Reaction Occurs in the Absence of Oxygen (an Ideal Autolytic Reaction Only by Heat):

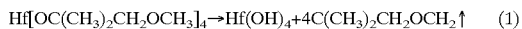
$$Hf[OC(CH_3)_2CH_2OCH_3]_4 \rightarrow Hf(OH)_4 + 4C(CH_3)_2CH_2OCH_2\uparrow \quad (1)$$

$$Hf(OH)_4 \rightarrow HfO_2 + 2H_2O \quad (2)$$

B. The Case Where an Ideal Reaction Occurs in the Presence of Oxygen (the Case of a Complete Combustion):

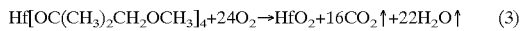
$$Hf[OC(CH_3)_2CH_2OCH_3]_4 + 24O_2 \rightarrow HfO_2 + 16CO_2\uparrow + 22H_2O\uparrow \quad (3)$$

where the symbol ↑ means a volatile material.

In the above chemical reaction formulae, if the larger size numbers or the coefficients are considered, just as they are, to be a mole ratio of raw materials on a substrate, the ratios are as follows:

In the absence of oxygen,
$HfO_2$: (other impurities)=1:(4+2)=1:6.
In the presence of oxygen,
$HfO_2$: (other impurities)=1:(16+22)=1:38.

As a result, the total number of the moles of the impurities which occur when 1 mole of $HfO_2$ is generated in the presence of oxygen is larger than that in the absence of the oxygen.

In addition, a comparison of the numbers of the cleavage for cleaving respective bonds in the chemical formulae is as follows:

In the absence of oxygen: four cleavages for respective O—C, C—H and O—H total 12 cleavages.
In the presence of oxygen: 12 cleavages for O—C and 44 cleavages for C—H total 56 cleavages.

Since a larger number of the cleavage produces a larger amount of radicals, the impurities are more likely to be incorporated into the film.

In conclusion, it is preferable that the film formation be performed in the absence of oxygen and [C(CH_3)_2CH_2OCH_2] in the above formula (1) is allowed to volatilize at such a temperature that decomposition of [C(CH_3)_2CH_2OCH_2] does not occur, to form the $HfO_2$ film.

Figure 2:
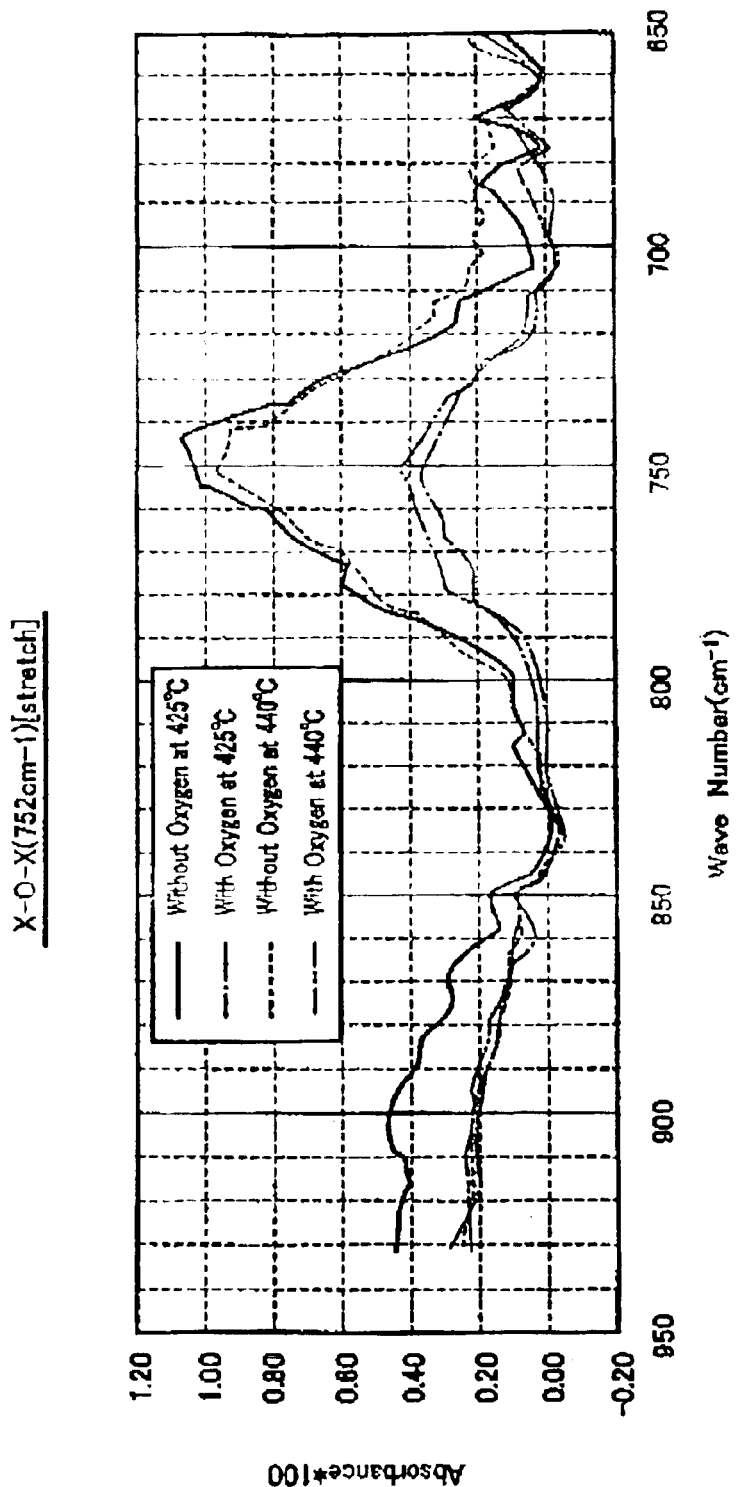
FIG. 2 is a diagram for comparison of bonding degrees of Hf—O—Hf bond in a case of formation without oxygen and a case of formation with oxygen, when forming an HfO$_2$ film.
Figure 3:
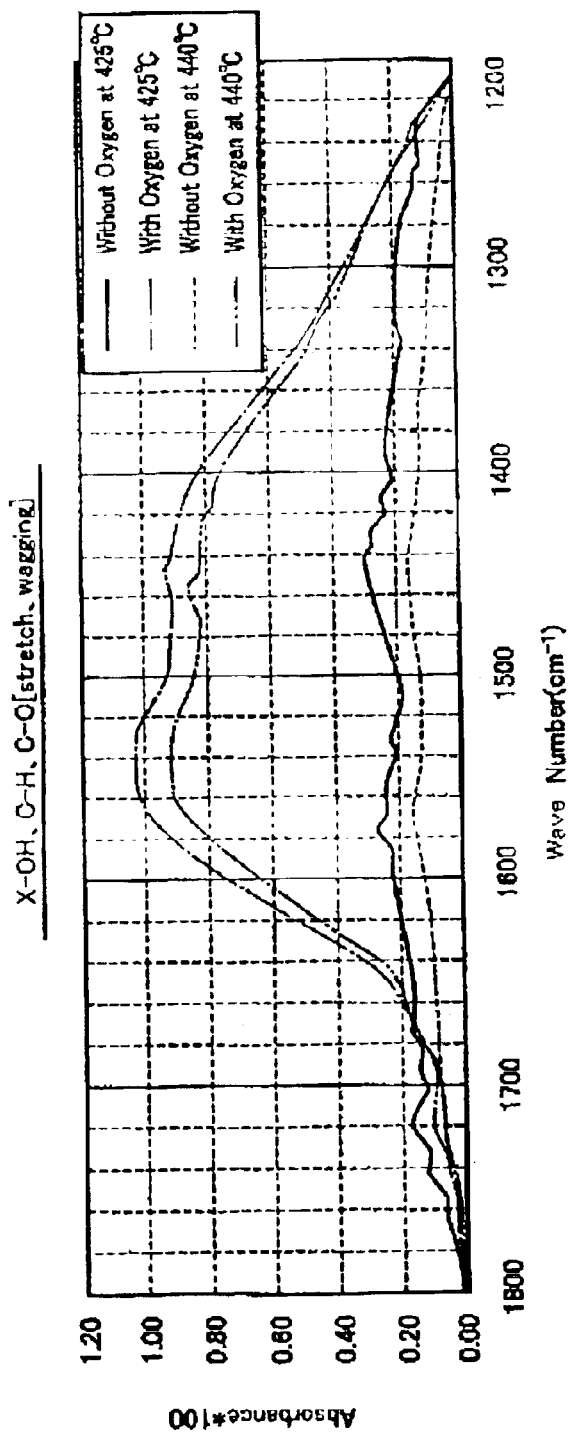
FIG. 3 is a diagram of for comparison of impurity amounts (—OH, C—H, C—O) contained in HfO$_2$ films in a case of formation without oxygen and a case of formation with oxygen, when forming an HfO$_2$ film.

It is also supported that the formation of $HfO_2$ film in the absence of oxygen is preferable compared to the formation in the presence of oxygen, by FIG. 2 and FIG. 3 in which the influence of $O_2$ addition amount on the thin film is measured by FTIR (Fourier Transform Infrared Spectroscopy).

FIG. 2 shows a comparison of film quality characteristics of thin films between the case of the absence of oxygen and the case of the presence of oxygen. The wave number ($cm^{-1}$) is shown as abscissa and the absorbance for film formation temperatures of 425° C. and 440° C. is shown as ordinate. In addition, in the case of the presence of oxygen, the oxygen flow rate is 0.5 SLM. As shown in the diagram, in particular, by exciting a stretch mode around a wave number of 752 $cm^{-1}$, the absorbance reflecting an X—O—X bond representing an Hf—O—Hf bond in the absence of oxygen is higher than that in the presence of oxygen. That is, the film quality in the case of the absence of oxygen is better than that in the presence of oxygen.

FIG. 3 shows a comparison of characteristics of the impurity amount contained in films between the case of the absence of oxygen and the case of the presence of oxygen. The wave number ($cm^{-1}$) is shown as abscissa and the absorbance for film formation temperatures of 425° C. and 440° C. is shown as ordinate. In addition, in the case of the presence of oxygen, the oxygen flow rate is 0.5 SLM. As shown in the diagram, it turned out that, by exciting a stretch mode and a wagging mode, the absorbance reflecting impurity amounts (—OH, C—H and C—O) in the presence of oxygen is higher than that in the absence of oxygen so that the absorbance of the film in the film formation in the presence of oxygen is about five times as high as that in the film formation in the absence of oxygen. This shows that the impurity amounts in the absence of oxygen are smaller than those in the presence of oxygen so that the film quality in the case of the absence of oxygen is better than that in the presence of oxygen. Therefore, if $O_2$ is not used during film formation of the $HfO_2$ film, mixing amounts of CH and OH in the film can be reduced so that the film can be modified sufficiently. In addition, the present invention does not completely eliminate the case in the presence of $O_2$, but includes the case of introducing a small amount of $O_2$ to such an extent that the amount of $O_2$ is not substantially different from the case where $O_2$ is not introduced during the film formation. Even in such a case, the modification of the film is sufficiently possible.

Here, each temperature zone and each mechanism of the film formation using an adsorption reaction, a semi-autolytic reaction and an autolytic reaction of a raw material will be explained in relation to the present invention. All CVD reactions are in a state in which an autolytic reaction and an adsorption reaction occur at the same time. When the substrate temperature is decreased, the adsorption reaction predominates. When the substrate temperature is increased, the autolytic reaction predominates. The substrate temperature is kept at a temperature intermediate both the cases, a semi-autolytic reaction also occurs. In the case of using Hf-$(MMP)_4$, it is considered that the adsorption reaction predominates at a temperature of 300° C. or lower, and the autolytic reaction predominates at a temperature of higher than 300° C. However, there is no case where the adsorption reaction does not occurs in any temperature zones. The reaction formula of the autolytic reaction of Hf-$(MMP)_4$ is as shown in the above formula (1) and formula (2). Moreover, the reaction formula of the case where Hf-$(MMP)_4$ which is adsorbed onto a substrate by an adsorption reaction is oxidized by the RPO process and the like, to allow a film formation reaction to occur, is the same reaction formula as in the above-described case where Hf-$(MMP)_4$ reacts with $O_2$ in the gas phase (gas phase reaction), which is as shown in the above formula (3). In the MOCVD according to the present invention, since the impurity removing effect by RPO is obtained whichever of the above reactions predominates, the reaction form is not particularly specified. In the MOCVD according to the present invention, however, the experimental result is obtained that impurities in the film in the case where the autolytic reaction predominates can be smaller in quantity.

(2) The RPO Process

By the RPO process using in the film-modifying step after the film formation, the impurities such as hydrogen (H), carbon (C) and the like in the film can be effectively removed to make it possible to reduce their concentration so that an electrical property of the film can be enhanced. Moreover, by allowing hydrogen (H) to leave the film, an Hf atom is restrained from moving so that the crystallization of the film can be prevented to enhance the electrical property of the film. Furthermore, oxidation of the film can be also accelerated, and it is further possible to repair an oxygen defect in the film. In addition, it is possible to quickly remove the gas leaving the accumulated films which are deposited on portions except a substrate, such as a reaction chamber inner wall, a susceptor and the like so that film thickness control with high reproducibility becomes possible.

Moreover, although the RPO process is used in the film-modifying step in the embodiment, the present invention is not limited to this embodiment. Alternatives of the RPO process (the following (i)) are, for example, as follows (the following (ii) to (viii)).

(i) The RPO process which is performed by mixing $O_2$ into Ar (an inert gas);

(ii) An RPN process which is performed by mixing $N_2$ into Ar;

(iii) An RPNH process which is performed by mixing $N_2$ and $H_2$ into Ar;

(iv) An RPH process which is performed by mixing $H_2$ into Ar;

(v) An RPOH process which is performed by mixing $H_2O$ into Ar;

(vi) An RPOH process which is performed by mixing $O_2$ and $H_2$ into Ar;

(vii) An RPON process which is performed by mixing $N_2O$ into Ar; and (viii) An RPON process which is performed by mixing $N_2$ and $O_2$ into Ar.

In addition, merits of the embodiment in which the $HfO_2$ film formation and the RPO process are performed in the same reaction chamber are as follows. If the film formation of an $HfO_2$ film is performed, the $HfO_2$ film is also formed on a reaction chamber inner wall, a shower head, a susceptor and the like. This is referred to as an accumulated formation film. In the case that the $HfO_2$ film formation and the RPO process are performed in different reaction chambers, respectively, in the $HfO_2$ film formation reaction chamber in which the RPO process is not performed, C and H are released from the accumulated formation film to contaminate the inside of the reaction chamber. Moreover, the amounts of the C and H released from the accumulated formation film are increased as the thickness of the film is increased. As a result, it is difficult to make the amounts of C and H of all substrates to be processed be constant.

On the contrary, in the case that the $HfO_2$ film formation and the RPO process are performed in the same reaction chamber, not only C and H in the film formed on the substrate but also C and H in the accumulated formation film adhering to the inside of the reaction chamber can be removed (a cleaning effect) so that it is possible to allow the amounts of C and H of all substrates to be constant.

(3) The Cycle Process

By the cycle process, the efficiency of removal of impurities in a film can be increased as stated above. The film also can be maintained in an amorphous state, and as a result, a leak current of the film can be decreased. Moreover, the evenness of the film surface can be improved so that the thickness uniformity can be enhanced. In addition, the film can be densified (maximization of a defect repairing effect), and it is possible to precisely control the deposition rate. Furthermore, an undesirable interface layer formed at an interface between a base of the film formation and a deposited film can become thin.

Figure 4:
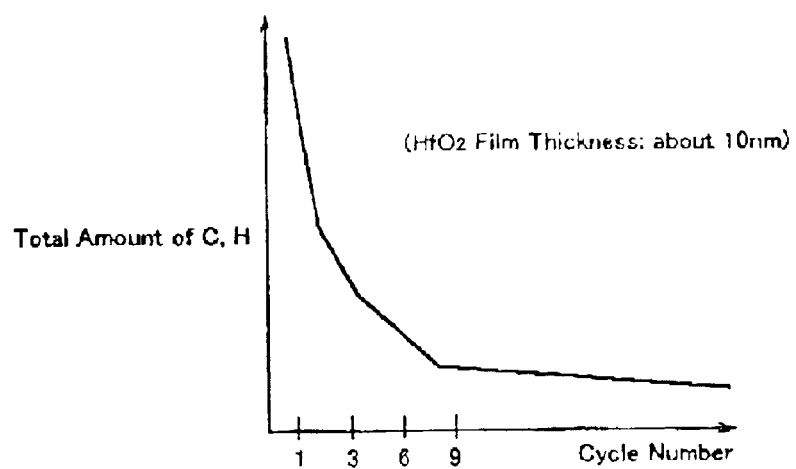
FIG. 4 is a graph for showing a relation between a cycle number and a C, H impurity total amount in an HfO$_2$ film.

The impurity amounts of C and H contained in the $HfO_2$ film (for example, a film thickness of 10 nm) formed in the cycle process can be substantially decreased in accordance with the increase in cycle number as shown in FIG. 4. The cycle number is shown as abscissa and the total amount of C and H (in arbitrary unit) is shown as ordinate. In addition, the film obtained when the cycle number is one corresponds to the film obtained by the conventional method.

According to FIG. 4, since the effect of decreasing the impurity amounts in the $HfO_2$ film such as CH, OH and the like becomes enhanced by approximately three cycles when the total film thickness of the $HfO_2$ film formed by the cycle process is 10 nm (100 Å), it is preferable that the film thickness of the film formed for each cycle be approximately 30 Å or less. In addition, in CVD, since the film thickness formed in one film formation is approximately 0.5 Å, it is preferable that the film thickness of the film formed for each cycle be approximately 0.5 Å–30 Å. In particular, since the effect of decreasing the impurity amounts in the $HfO_2$ film such as CH, OH and the like becomes extremely enhanced by approximately seven cycles and the effect of decreasing the impurity amounts becomes slightly better by more than seven cycles but has not a significant change, it is considered more preferable that the film thickness of the film formed for each cycle be approximately 15 Å (five atomic layers). If the film with a film thickness of 30 Å or more is deposited by one cycle, the impurities in the film become plenty so that the film immediately crystallizes to be in a polycrystalline state. Since the polycrystalline state is a state in which there are not any openings, it becomes difficult to remove C, H and the like. However, in the case that the film thickness formed by one cycle is thinner than 30 Å, it becomes difficult to form a crystallized structure so that the thin film can be maintained in an amorphous state regardless of the presence of the impurities. Since the amorphous state is a state in which there are many openings (a state full of openings or like a pithy state), the thin film is deposited while maintaining an amorphous state and the RPO process is performed before the thin film crystallizes so that it becomes easy to remove the impurities in the film such as C, H and the like. That is, the film formed by two or more cycles of the cycle process where the film thickness of the film formed for each cycle is set at approximately 0.5 Å–30 Å is in a state where the film is difficult to crystallize. In addition, the amorphous state has a merit where the amorphous state is more difficult to pass a leak current through than the polycrystalline state.

Figure 5:
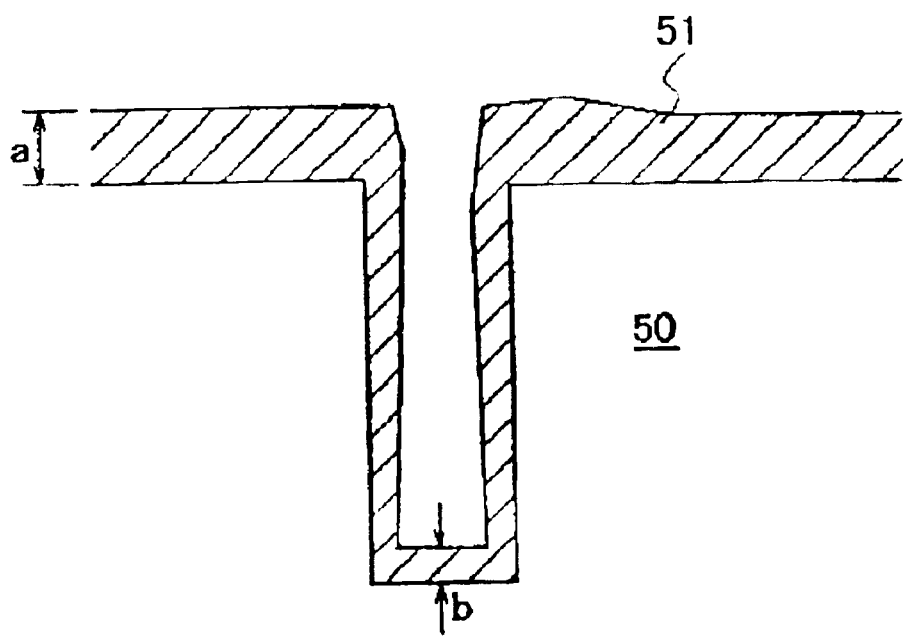
FIG. 5 is a cross sectional view for showing a state of formation of an HfO$_2$ film on an substrate.

Furthermore, the reason that the efficiency of removal of impurities in the $HfO_2$ film can be increased by repeating the $HfO_2$ film formation→the RPO process, two or more times, is as follows. In the case of performing the RPO process (a modification process of C, H and the like) on the $HfO_2$ film formed onto a pattern channel with good coverage, if the RPO process is performed after a thick $HfO_2$ film, for example, with a thickness of 100 Å is formed at a time, it becomes difficult to supply a oxygen radical to a deep portion b of the channel in FIG. 5. This is because, in the process where the oxygen radical reaches the deep portion b of the channel, the probability of reaction of the oxygen radical with C and H at a site of a surface a in FIG. 5 becomes high (since the film thickness of 100 Å is thick, and the impurity amounts are large in proportion to the thickness), so that the radical amount reaching the deep portion b of the channel is decreased relatively. As a result, it becomes difficult to perform a uniform C and H removal in a short period of time.

On the contrary, in the case of performing the $HfO_2$ film formation→the RPO process not at a time but seven times by dividing the $HfO_2$ film formation→the RPO process into seven when forming an $HfO_2$ film with a thickness of 100 Å, with regard to the RPO process, it is necessary only to perform a process of removing C and H on an $HfO_2$ film per 15 Å. In such a case, the probability of reaction of the oxygen radical with C and H at the site of the surface a in FIG. 5 does not become high (since the film thickness of 15 Å is thin, and the impurity amounts are small in proportion to the thickness), so that the radical reaches the deep portion b of the channel uniformly. As a result, by repeating the $HfO_2$ film formation→the RPO process, two or more times, it is possible to perform a uniform C and H removal in a short period of time.

Further, by performing a cycle process of successively repeating a film-forming step and a film-modifying step two or more times, the mixing amounts of impurities such as C, H and the like contained in the accumulated film adhering to the inside of the reaction chamber can be substantially decreased, and also a released gas from the accumulated film can be substantially reduced, so that it becomes possible to keep the quality of the continuously produced $HfO_2$ films being constant. Therefore, compared to the conventional method, it becomes unnecessary to frequently practice a removal process of an accumulated film by self-cleaning, so that a reduction of manufacturing costs can be achieved.

(4) A Rotation Mechanism

In the embodiment, since the substrate 4 is rotated by the substrate rotation unit 12, a raw material gas introduced from the film formation raw material supply unit and a gas activated by plasma (hereinafter referred to as a radical) as a reactant introduced from the reactant activation unit 11 quickly and uniformly spread over in the substrate surface, respectively, so that the film can be uniformly deposited in the whole substrate surface and impurities in the film can be quickly removed uniformly in the substrate surface to modify the whole film.

(5) Sharing of a Shower Head

If a film formation gas supplied to a substrate in the film-forming step and a radical as a reactant supplied to the substrate in the film-modifying step are supplied through the shower head 6 which becomes the same supply port, foreign substances (particle sources) which adhere to the inside of the shower head 6 can be covered and coated with an $HfO_2$ film so that the foreign substances can be restrained from falling down on the substrate 4. In addition, the film coated on the inside of the shower head is exposed to the reactant after coating to thereby make it possible to substantially decrease the mixing amounts of the impurities such as C, H and the like contained in the coated film inside of the shower head. Moreover, in the case of cleaning the reaction chamber 1 with a gas containing Cl such as $ClF_3$ and the like, the cleaning gas and by-products which remain in the reaction chamber 1 and inside of the shower head 6 are adsorbed onto the insides of the reaction chamber 1 and the shower head 6 (this referred to as a cleaning residue). However, by allowing the supply port to be shared with a raw material gas and a reactant, the cleaning residue can be removed effectively.

(6) A Bypass Tube

In the embodiment, a bypass tube 14 (14a and 14b) which is provided on film formation gas and radical supply systems, respectively is adapted to exhaust the radical/gas to be used in the subsequent step through the bypass tube 14 without stopping the supply of the radical/gas while supplying the gas/radical. The supply of the raw material gas/radical requires a preparation, and some time elapses before the supply of the gas/radical starts. Therefore, during the process, the supply of the raw material gas/radical is always allowed to continue without stopping, and exhaustion of the gas/radical is performed through the bypass tube 14 when no gas/radical used so that when the gas/radical used, only by switching operation using the valves 21 to 24, the supply of the raw material gas/radical can be immediately allowed to start thereby making it possible to enhance a throughput.

(7) Sharing of a Trap

In the embodiment, the trap 16 is shared with a film formation gas and radical exhaust systems. That is, since the exhaust tube 7 is provided with the raw material recovery trap 16 for recovering a raw material to which the bypass tube 14 is connected as shown in FIG. 1, a trapped liquid raw material can be converted into a solid by an oxygen radical so that an entry of the raw material into an exhaust pump (not shown) owing to the raw material being vaporized again can be prevented. Thereby, a raw material recovery rate can be increased, an entry of a raw material into an exhaust pump and an apparatus for removing hazardous materials (not shown) can be reduced, and a maintenance cycle of a substrate processing apparatus can be significantly extended.

(8) Use of a Plasma Source

In the embodiment, a plasma source used for activating a gas in the RPO process in the film-modifying step and a plasma source used for activating a cleaning gas in the cleaning step are one plasma source shared with both the steps. In the cleaning step, a film adhering to the inside of the reaction chamber is removed using the cleaning gas activated by plasma generated in the reactant activation unit 11, and also in the film-modifying step, a film is modified using a reactant activated by plasma generated in the reactant activation unit 11. Since one plasma source is shared with the reactant activation and the cleaning gas activation, control of the plasma source becomes easy and a semiconductor device can be manufactured at a low cost.

(9) Processes Performed in the Same Apparatus

According to the embodiment, since the steps from the metal oxide film formation by ($HfO_2$ film formation→RPO process)×n cycles to the electrode formation are performed in a same apparatus, the temperature raising time of the substrate can be saved in comparison with the case wherein the electrode formation is performed in a different apparatus. Moreover, the electrode can be formed on the film surface which remains in a clean state. Furthermore, since the metal oxide film is densified by thermal annealing performed when forming the electrode, the electrode can be formed after forming the metal oxide film, without performing an annealing step as a different step from the electrode formation step of the metal oxide film, in addition, the film becomes difficult to contaminate. This will be specifically explained below.

Figure 6:
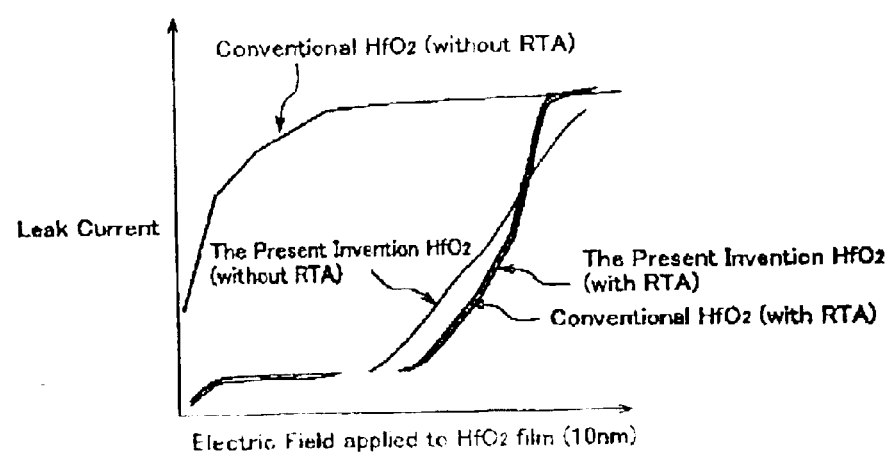
FIG. 6 is a graph for showing a relation between a cycle number and an insulation property.

FIG. 6 shows an electrical insulation property before and after an RTA process with regard to an $HfO_2$ film obtained by 7 cycle process (the present invention) in the embodiment and an $HfO_2$ film obtained by 1 cycle process (the conventional method). The electric field (in arbitrary unit) applied to the $HfO_2$ film (10 nm) is shown abscissa and the leak current (in arbitrary unit) is shown as ordinate. In addition, the RTA process here means a thermal annealing treatment rapidly performed on a substrate under atmospheric pressure (in an atmosphere of $O_2$) while heating the substrate to a temperature in the neighborhood of 700° C. In the drawing, the conventional $HfO_2$ represents an $HfO_2$ film obtained by one cycle process, and the present invention $HfO_2$ represents an $HfO_2$ film obtained by seven cycle process. Moreover, the term "without RTA" represents the film before the RTA process, and the term "with RTA" represents the film after the RTA process. According to FIG. 6, the $HfO_2$ film (the conventional $HfO_2$ film (without RTA)) obtained by 1 cycle process which has large mixing amounts of CH and OH shows a significant change in insulation property before and after the RTA. As compared with this, it is understood that the insulation film (the present invention $HfO_2$ film (without RTA)) obtained by 7 cycle process of the embodiment shows little change in insulation property at early stages (in the state without being subjected to electrical stress for a long time) before and after the RTA due to small mixing amounts of CH and OH. Therefore, by performing the cycle process of the present embodiment, the RTA process required to ensure enhancement of electrical insulation of a thin film and stability of the film can be eliminated.

Figure 7:
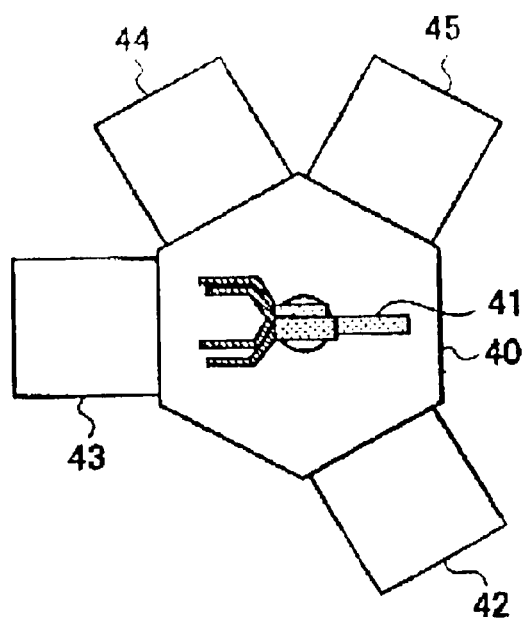
FIG. 7 is a conceptual illustration for showing a cluster apparatus construction in an embodiment.

By eliminating this RTA process, construction of a cluster apparatus can be simplified. This will be explained by using FIG. 7 showing a cluster apparatus construction.

The cluster apparatus includes a substrate transfer chamber 40 provided with a substrate transfer robot 41, a load-lock chamber 42 for loading/unloading a substrate into or from the apparatus, a first reaction chamber 43 for perform a surface treatment (such as RCA cleaning and the like) on the substrate, a second reaction chamber 44 for forming an $HfO_2$ film as the CVD reaction chamber shown in FIG. 1, and a third reaction chamber 45 for forming an electrode on the thin film.

Figure 20:
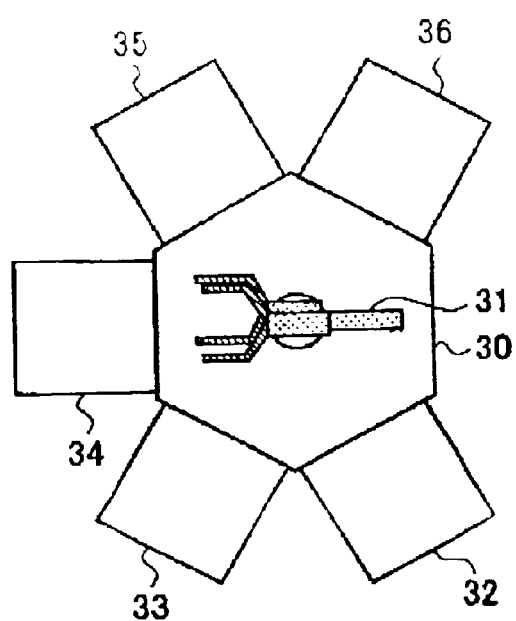
FIG. 20 is a conceptual illustration for showing a cluster apparatus construction in a conventional example.

In the conventional cluster apparatus construction (refer to FIG. 20), a substrate surface treatment has been performed in the first reaction chamber 33, an $HfO_2$ film has been formed in the second reaction chamber 34, the RTA process has been performed the third reaction chamber 35, and an electrode has been formed in the fourth reaction chamber 36. On the contrary, according to the embodiment of FIG. 7, after a substrate is loaded into the load-lock chamber 42 from the outside of the apparatus, the substrate surface treatment such as RCA cleaning and the like is performed, and the $HfO_2$ film formation and the modification process are repeated (the $HfO_2$ film formation→the modification process→the $HfO_2$ film formation→the modification process→ - - - ,) to form an $HfO_2$ film with a prescribed film thickness, and an electrode is formed (a poly-Si thin film formation and a thermal annealing treatment) in the third reaction chamber 45. The substrate on which the electrode is formed is then unloaded from the load-lock chamber 42 to the outside of the apparatus.

Figure 8:
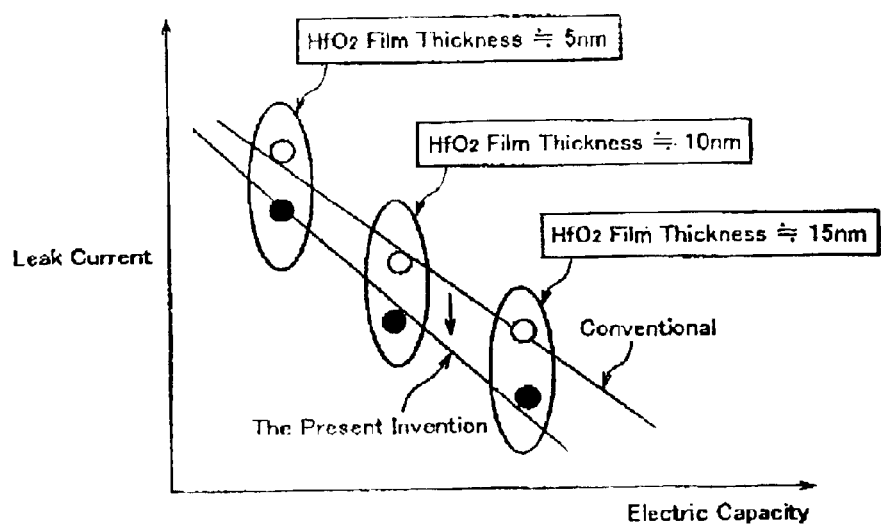
FIG. 8 is a graph for showing electrical properties of HfO$_2$ films according to cluster apparatus constructions in an embodiment and a conventional example.

FIG. 8 shows a graph for showing a comparison of electrical properties of $HfO_2$ films according to cluster apparatus constructions in the embodiment and the conventional example as stated above. The electrostatic capacity (in arbitrary unit) is shown as abscissa and the leak current (in arbitrary unit) when the $HfO_2$ film is about 5 nm, about 10 nm, and about 15 nm is shown as ordinate. This graph indicates that the $HfO_2$ film characteristic (filled circles in the graph) obtained by the cluster apparatus shown in FIG. 7 according to the embodiment (wherein the $HfO_2$ film is formed by seven cycle process) is superior to the $HfO_2$ film characteristic (unfilled circles in the graph) obtained by the conventional cluster apparatus shown in FIG. 20 (wherein the $HfO_2$ film is formed by one cycle process). This result indicates that the RTA process becomes unnecessary. It is considered that the reason why such a cluster construction eliminating the need of the RTA process can be realized is that a CH and OH removal process of removing CH and OH from the $HfO_2$ film is sufficiently performed by the process according to the present embodiment in the second reaction chamber 44 of FIG. 7.

In the present embodiment, therefore, the reaction chamber for RTA can be omitted from a cluster apparatus to achieve the simplification of the construction of the cluster apparatus. In addition, since the RTA process for removing CH and OH is not performed, the surface state of the $HfO_2$ film does not lose evenness, and lowering of insulation and stability of the $HfO_2$ film due to partial crystallization of the film does not occur.

In the embodiment, after the $HfO_2$ film is formed in the second reaction chamber 44, the electrode is formed in the third reaction chamber 45 in the same cluster apparatus without performing an RTA process. Merits of such a case that, after formation of an $HfO_2$ film (the second reaction chamber), the steps to electrode formation (the third reaction chamber) are performed in the same apparatus, are as follows.

(i) An additional temperature raising time required for raising a substrate again after the substrate is taken out from one apparatus and loaded into another apparatus, can be saved;

(ii) Since an $HfO_2$ film is densified by thermal annealing at a temperature of 700° C. or more performed during electrode formation, the film surface becomes difficult to contaminate; and (iii) An electrode can be formed on the $HfO_2$ film surface which remains in a clean state.

In addition, a substrate may be taken out from one apparatus to the outside of the apparatus after formation of an $HfO_2$ film (the second reaction chamber), and be subjected to electrode formation in another apparatus. The case that an electrode is formed in another apparatus as noted above, however, has the following demerits.

(i) In the case that a substrate is taken out from an apparatus to the outside of the apparatus, an additional temperature raising time is required for heating the substrate again so that a useless processing time occurs; and (ii) The $HfO_2$ film formed at a low temperature is liable to be contaminated at the surface of the $HfO_2$ film by an atmosphere outside of the apparatus, and also likely to vary with time (becoming a cause of electrical property degradation of a device).

To resolve these demerits, an RTA process is preferably performed prior to electrode formation. Even in the case of the cluster apparatus shown in FIG. 7, for example, if the RTA process is performed in the third reaction chamber 45 after an $HfO_2$ film is formed (the second reaction chamber 44), subsequent electrode formation performed even in another apparatus does not cause any problems. In general, the more densified at a high temperature a film is, the smaller openings between atoms the film has, so that the film is in a state where contaminants ($H_2O$, an organic material and the like) have difficulty in diffusing into the $HfO_2$ film. Therefore, the reason why the subsequent electrode formation performed even in another apparatus does not cause any problems is that, the $HfO_2$ film being subjected to high temperature annealing by the RTA process to be densified, becomes difficult to contaminate with an atmosphere outside of the apparatus, or to vary with time.

(10) Modified Examples

In addition, in the above-mentioned embodiment, a raw material gas supplied to a substrate in the film-forming step and an oxygen radical as a reactant supplied to the substrate in the film-modifying step are supplied through the same supply port by allowing a shower head to be shared with both the steps, the inner space of the shower head may be divided into two, one for the film formation and the other for the reactant, to supply the raw material gas and the reactant through different supply ports, respectively. In this case, it is preferable that, when the raw material gas is supplied to the substrate through the supply port for the raw material gas in the film-forming step, a nonreactive gas be supplied to the supply port for the reactant, and, when the reactant is supplied to the substrate through the supply port for the reactant in the film-modifying step, a nonreactive gas be supplied to the supply port for the raw material gas. Thus, if the raw material gas and the reactant are supplied through different supply ports respectively, and in the respective steps, a nonreactive gas such as an inert gas and the like is supplied through the supply port for one of the steps which is not involved in the currently performed step, the accumulated film can be restrained sufficiently from forming onto the inside of the supply ports. This will be explained in detail below by using FIG. 9. Moreover, the construction shown in FIG. 9 is the same as the construction of FIG. 1 except the point that the shower head 6 is provided with a partition plate 15.

If the raw material adhering to the inside of the shower head 6 reacts with the oxygen radical as the reactant, an accumulated film is also formed onto the inside of the shower head 6. In order to restrain the accumulated film from forming, the shower head 6 is divided into two (6a, 6b) by the partition plate 15. By dividing the shower head 6 through which the raw material gas and the oxygen radical are supplied, the reaction between the raw material gas and the oxygen radical can be prevented effectively.

Moreover, in addition to dividing the shower head 6, it is preferable that, in the case of allowing the film formation gas flow to the substrate 4, a nonreactive gas be allowed to flow to the activated gas shower head portion 6b from the radical supply side (the reactant activation unit 11), and, in the case of allowing the oxygen radical to the substrate 4, a nonreactive gas be allowed to flow to the film formation shower head portion 6a from the raw material supply side (the film formation raw material supply unit 9, the inert gas supply unit 10). Thus, if a nonreactive gas is supplied to the shower head portions 6a or 6b which is not used in the currently performed step of the film-forming step and the film-modifying step, respectively, the accumulated film can be restrained further effectively from forming onto the inside of the shower head 6.

Figure 9:
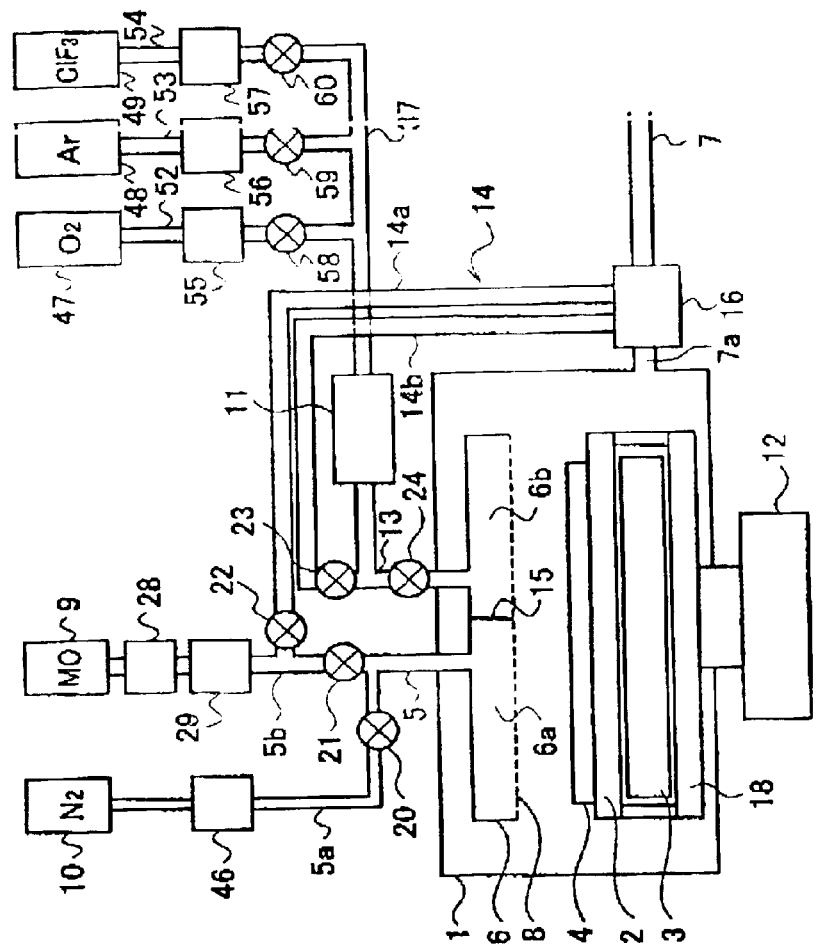
FIG. 9 is an explanatory schematic view of a reaction chamber in a modified example.
Figure 9:
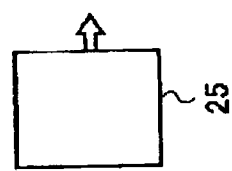
Figure 10:
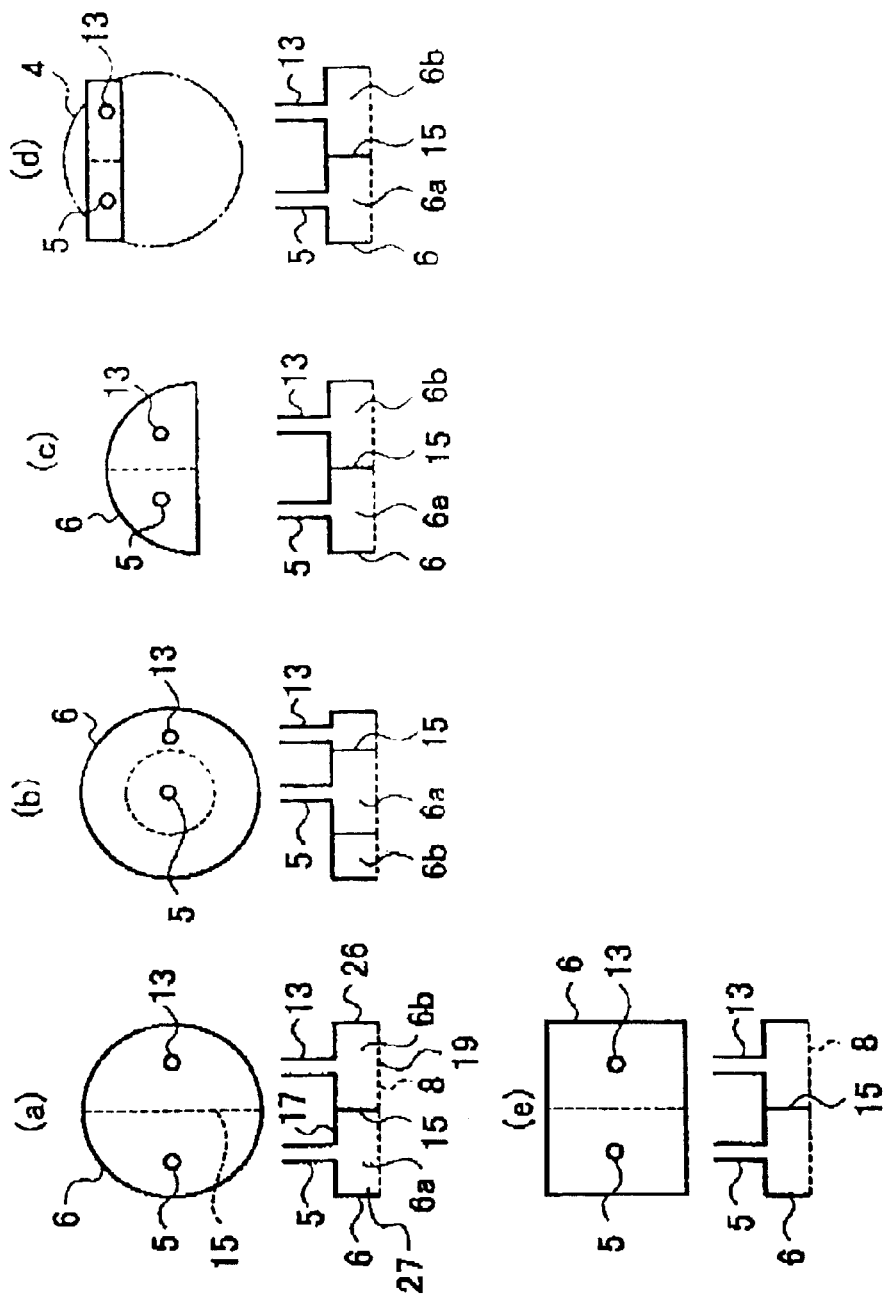
FIG. 10 is an explanatory view for showing various types of examples of shower head shapes according embodiments.

The shower head 6 applied to FIG. 9 can be constructed in a variety of shapes. Such various kinds of shapes of the shower head 6 are shown in FIG. 10. Points which are common to the constructions of the shower heads of various kinds of shapes shown in FIGS. 10(a)–(e) are as follows. The shower head 6 comprises a shower plate 19 which has many holes 8, a back plate 17, a perimetrical wall 26, a gas space 27 defined inside of the shower head 6 by the plate 19, the back plate 17 and the wall 26, and the partition plate 15 which partitions the gas space 27 to be divide into two shower head portions 6a and 6b. From the side of the back plate 17 of the shower head 6 as constructed in such a way, the raw material supply tube 5 and the radical supply tube 13 are connected to the two shower head portions 6a and 6b, respectively.

In FIG. 10(a), the gas space 27 is of disk shape, and the partition plate 15 is provided in the diametrical direction of the disk-shaped gas space 27 to provide the shower head portions 6a and 6b on both sides of the diameter, namely, on the right and left sides in the drawing. In FIG. 10(b), the gas space is of disk shape, and the partition plate 15 is provided concentrically with the disk-shaped gas space, and the shower head portions 6a and 6b are provided in an coaxial double tube shape.

In FIGS. 10(a) and (b) as stated above, a basic shape of the shower head 6 is constructed to be a circle which is symmetric with respect to a point. However, since the substrate is rotated in the present embodiment, the basic shape of the shower head 6 can be a shape such as a semicircle, a rectangle or the like which is symmetric with respect to a line rather than a circle which is symmetric with respect to a point. Such examples are shown in FIG. 10(c) to FIG. 10(e).

In FIG. 10(c), the gas space is of semi-disk shape, and the partition plate 15 is provided in the radial direction of the semi-disk-shaped gas space to provide the shower head portions 6a and 6b on both sides of the radius, namely, on the right and left sides in the drawing. In FIG. 10(d), the gas space is of elongated rectangular board shape, and the partition plate 15 is provided in the midsection to provide the shower head portions 6a and 6b on both sides of the midsection, namely, on the right and left sides in the drawing. In FIG. 10(e), the gas space is of rectangular board shape, and the partition plate 15 is provided in the midsection to provide the shower head portions 6a and 6b on both sides of the midsection, namely, on the right and left sides in the drawing. Thus, the shower head 6 can be constructed in a variety of shapes.

Furthermore, in the embodiments as stated above, the case has been explained in which an $HfO_2$ film is formed on a substrate, particularly, in the construction including the following (1) to (3).

(1) A film formation gas used in the film-forming step and a radical as a reactant used in the film-modifying step are supplied through the same supply port (shower head) so that the film formation gas and the radical are mixed. In the modified example, the film formation gas and the radical are supplied through different supply ports (divided shower head) so that the film formation gas and the radical are not mixed;

(2) While supplying a film formation gas or an oxygen radical as a reactant, the oxygen radical as a reactant or the film formation gas to be used in the next step is exhausted through a bypass tube so that, only by switching operation using valves, the supply of the oxygen radical or the film formation gas to be used in the next step can be immediately allowed to start; and (3) A trap shared with the film-forming step and the film-modifying step is used to simplify the maintenance.

With regard to the above-noted three construction points, however, the present invention is not limited to the formation of an $HfO_2$ film. The present invention is applicable to the film formation of other kinds of films, such as, for example, $Ta_2O_5$ film, and the like.

EXAMPLES

Figure 11:
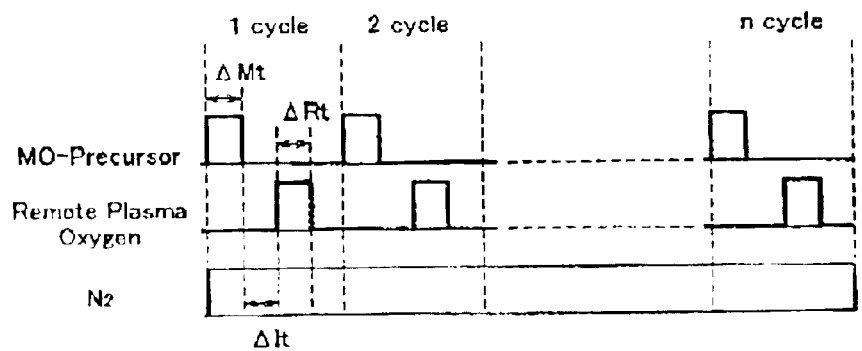
FIG. 11 is a diagram for showing a film formation sequence according to a cycle process of MOCVD and RPO in an example.

FIG. 11 shows a film formation sequence of a new MOCVD method using a cyclic remote plasma oxidation (RPO) in the present examples (a procedure of a cyclic method for repeating film formation by MOCVD and RPO, two or more times). Here, the process is performed using the substrate processing apparatus of FIG. 1.

A silicon wafer as a substrate is located on the suscepter in the reaction chamber, and if the temperature of the silicon wafer becomes stabilized, then:

(1) A gaseous Hf-(MMP)$_4$ raw material (MO-Precursor) vaporized with a vaporizer is introduced into the reaction chamber along with a dilution $N_2$ for a period of $\Delta Mt$ seconds;

(2) Then, the introduction of the gaseous Hf-(MMP)$_4$ raw material is stopped, and the inside of the reaction chamber is purged by a dilution $N_2$ for a period of $\Delta It$ seconds;

(3) After the purge of the inside of the reaction chamber, an oxygen activated with the remote plasma unit (Remote Plasma Oxygen) is introduced into the reaction chamber for a period of $\Delta Rt$ seconds. During this period of time, a dilution $N_2$ keeps being introduced;

(4) After the introduction of the oxygen activated with the remote plasma is stopped, the inside of the reaction chamber is purged by a dilution $N_2$ for a period of $\Delta It$ seconds, again; and (5) These steps from (1) to (4) (1 cycle) are repeated (n cycles) until the film thickness reaches a desirable value (thickness).

In the present examples, the flow rate of the Hf-(MMP)$_4$ was 0.05 g/min, the flow rate of the dilution $N_2$ was 0.5 SLM (standard liter per minute), and the flow rate of the oxygen introduced into the remote plasma unit was 0.1 SLM. Moreover, the pressure of the inside of the reaction chamber was controlled to be maintained at 100 Pa by an APC (auto pressure control) valve provided on the exhaust line. In order to measure a depo rate or deposition rate (film formation rate), the silicon substrate was used after removing a natural oxide film on the surface of the silicon substrate with a 1% dilute HF solution.

Figure 12:
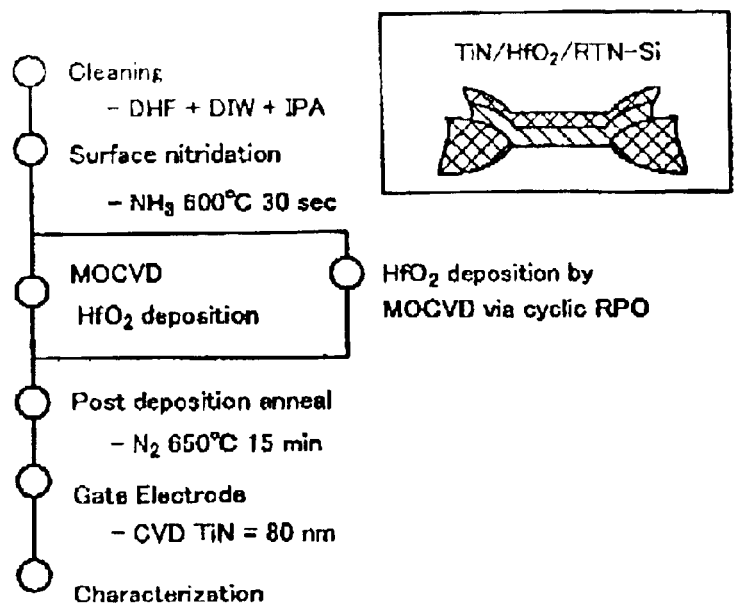
FIG. 12 is a diagram for explaining an n-MOS capacitor structure used for measurement of a C-V characteristic and an I-V characteristic in an example and a manufacturing procedure of the structure.

FIG. 12 shows an n-MOS capacitor structure for measurement of a current-voltage characteristic (I-V characteristic) and a capacitance-voltage characteristic (C-V characteristic) and a manufacturing process flow of the same.

In manufacturing an n-MOS capacitor, firstly, a p-type silicon wafer subjected to device isolation by an LOCOS method was used. Before film formation of an $HfO_2$ film, the silicon surface was subjected to etching with a 1% dilute HF solution in order to remove a natural oxide film and contaminants (Cleaning–DHF+DIW+IPA). Subsequently, by performing thermal annealing at 600° C. for 30 seconds (rapid thermal annealing) in an $NH_3$ atmosphere, the silicon surface was nitrided (Surface nitridation). An $HfO_2$ film was then formed by the above-described cycle process ($HfO_2$ deposition by MOCVD via cyclic RPO), and an annealing process was then performed at 650° C. for 15 minutes in an $N_2$ atmosphere (post deposition annealing) Subsequently, for gate electrode formation, a TiN film with a film thickness of 80 nm was grown by CVD (chemical vapor deposition) method using $TiCl_4$ and $NH_3$ at 650° C. (Gate Electrode-CVD TiN), and a gate electrode with an area of 1000 to 10000 $\mu m^2$ for an MOS capacitor was then formed by mask manufacturing according to photolithography and by etching. A effective oxide thickness (EOT) of the $HfO_2$ film was determined by applying a CVC program developed by NCSU to a C-V curve measured using an electrode with an area of 10000 $\mu m^2$. An I-V characteristic was measured using an electrode with an area of 1000 $\mu m^2$ at a temperature of 100° C. Moreover, in order to investigate qualities of the film, a TDS (thermal desorption spectroscopy) characteristic and a SIMS (Secondary Ion Mass Spectroscopy) profile were measured. Furthermore, in order to investigate a crystal structure of the film, a high-resolution transmission electron microscopy ([HRTEM] cross-section high-resolution transmission electron microscopy) image was observed.

Figure 13:
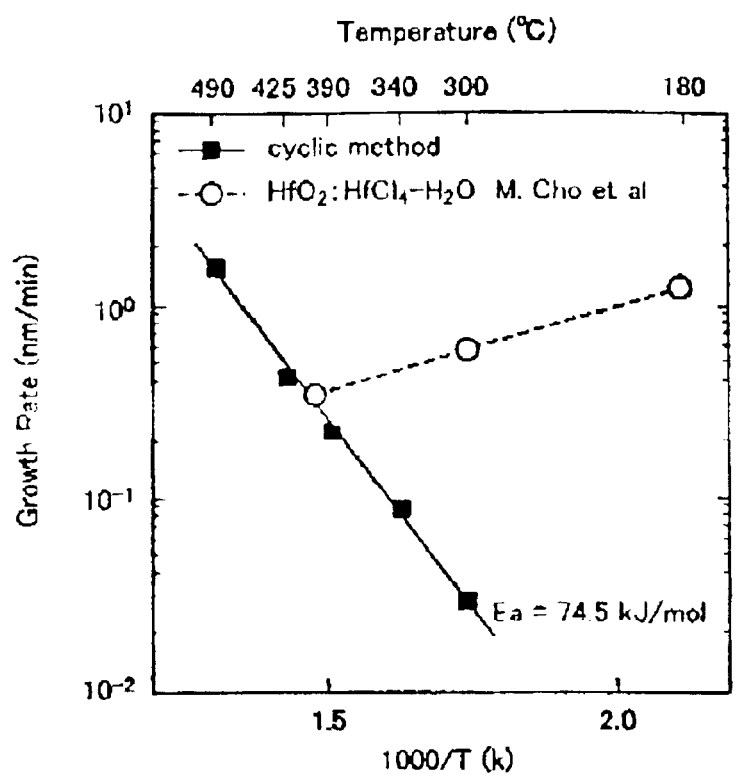
FIG. 13 is a graph for showing substrate temperature dependence of growth rate of an HfO$_2$ film formed according to a cycle process.

FIG. 13 shows substrate temperature dependence of a growth rate of the $HfO_2$ thin film formed using the above-stated cyclic method (filled circles in the graph). The ordinate shows the growth rate, and the abscissa shows the temperature. A step time for each of $\Delta Mt$, $\Delta It$ and $\Delta Rt$ in the cyclic method was set to be 30 seconds. As a comparative example, FIG. 13 also shows a data of $HfO_2$ formation conducted by Cho et al. according to ALD using $HfCl_4$ and $H_2O$ (unfilled circles in the graph). For comparison with the data of Cho et al., the film formation rate is converted and shown in units of nm/min.

In the case of ALD using $HfCl_4$ and $H_2O$, the film formation rate decreased from 1.2 nm/min to 0.36 nm/min as the substrate temperature (growth temperature) was changed (raised) from 180° C. to 400° C. This is because, in the case of ALD, an adsorption amount of the raw material on the wafer surface decreases by raising the substrate temperature. In the case of the new cyclic method invented by the present inventors, however, the film formation rate increased from 0.3 nm/min (0.6 nm/cycle) to 1.5 nm/min (3 nm/cycle) as the substrate temperature (growth rate) was raised from 300° C. to 490° C. This is because, autolysis of the raw material is accelerated by raising the film formation temperature. In addition, it has been found that, since the used liquid mass flow controller takes time until the flow rate becomes stabilized, only 8 seconds of $\Delta Mt$ of 30 seconds actually contributes to the film formation. Therefore, at low temperature, the film formation rate of the cyclic method is lower than that of ALD. If the time can be taken longer during which the raw material actually contributes to the film formation, the film formation rate even at a low temperature can be made larger than that of ALD.

The HfO$_2$ thin films with a film thickness of 30 nm formed by different cycle numbers using the cyclic method were estimated by TDS. FIGS. 14(a), (b) and (c) show TDS spectra for hydrogen, H$_2$O and CO of the HfO$_2$ thin films, respectively. Each four spectra in FIGS. 14(a), (b) and (c) relate to the HfO$_2$ thin films formed by 1, 10, 20 and 40 cycles according to the cyclic method at 425° C., respectively. In addition, step times for 1, 10, 20 and 40 cycle process are 1200, 120, 60 and 30 seconds, respectively. In other words, the films formed by 1, 10, 20 and 40 cycles were subjected to the RPO process for every 30, 3, 1.5 and 0.75 nm, respectively.

From FIG. 14(a), release of hydrogen from the samples of 10, 20 and 40 cycles are turned to be dramatically decreased compared to the sample of 1 cycle. In addition, from FIGS. 14(b) and (c), it is seen that release of CO hardly changes with the cycle number, on the other hand, release of H$_2$O gradually decreases with increasing cycle number. In the past, the present inventors compared a TDS spectrum of a sample subjected to the RPO process with that of a sample subjected no RPO process, and found that RPO after HfO$_2$ thin film formation has an effect in decreasing the mixing of hydrogen and H$_2$O into the film. From these facts, it can be concluded that the cyclic RPO process has an effect in decreasing the mixing of hydrogen and H$_2$O into the film.

Furthermore, in order to investigate a mechanism of impurity mixing into an HfO$_2$ thin film by Hf-(MMP)$_4$, an autolytic reaction of Hf-(MMP)$_4$ was studied in the following way.

Firstly, an Hf-(MMP)$_4$ solution was allowed to stand in an Ar gas at 300° C. for 5 hours, and then diluted with toluene and analyzed by GC-MS (Gas Chromatography-Mass Spectroscopy). Detected by-products were Hf-(MMP)$_4$, (CH$_3$)$_2$C=CHOCH$_3$ (olefin), (CH$_3$)$_2$CHCHO (isobutylaldehyde), (CH$_3$)$_2$CHCH$_2$OH (isobutanol), CH$_3$OH (methanol) and CH$_3$C(=O)CH$_3$ (acetone). The olefin was generated by separation of an HfO—C bond and separation of a hydrogen (H) bonded to a carbon (C) in the β position of MMP. It seems that the isobutylaldehyde, isobutanol, methanol and acetone were generated by decomposition of H-MMP and the olefin. The following formulae are considered appropriate for a reaction model of Hf-(MMP)$_4$.

Hf(MMP)$_4$→Hf(OH)4+4olefin  (4); or

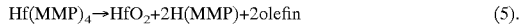

Hf(MMP)$_4$→HfO$_2$+2H(MMP)+2olefin  (5).

Here, according to the formula (4), it can be expected that hydrogen will be likely to enter into an HfO$_2$ film formed by MOCVD using Hf-(MMP)$_4$. This has been also confirmed by a TDS spectrum of the HfO$_2$ film formed by MOCVD which was measured in the past, and has agreed with the fact. According to FIG. 14, however, since hydrogen is hardly mixed into the film subjected to the RPO process for every film thickness of 3 nm or less, it seems that, in the RPO process, Hf(OH) is completely oxidized as shown in the following formulae.

Hf(OH)+O*→HfO$_2$+½H$_2$  (6); or

2Hf(OH)+3O*→2HfO$_2$+H$_2$O  (7), where O* is an oxygen radical.

Figure 14:
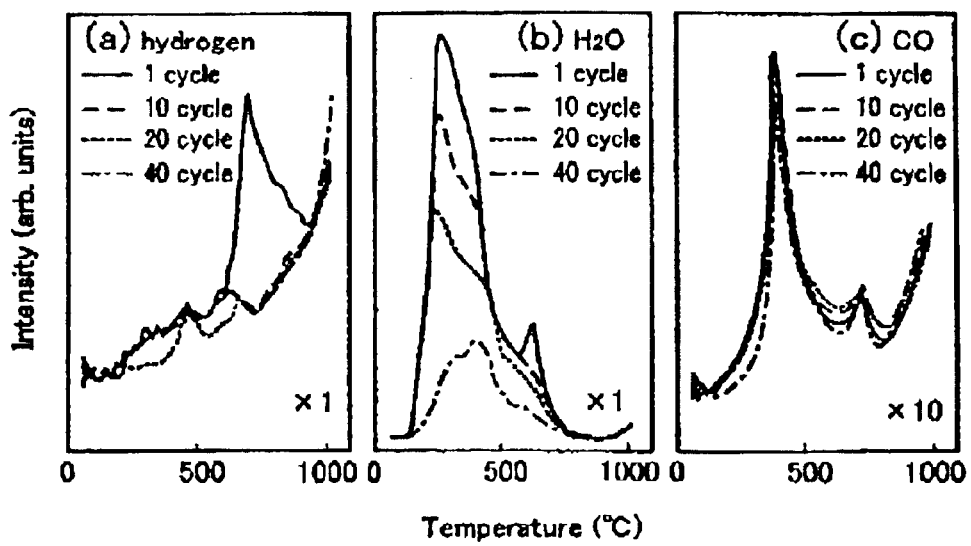
FIG. 14 is a graph for showing TDS spectra for hydrogen, H$_2$O and CO in HfO$_2$ films formed by different cycle numbers.

Here, even if the reaction of formula (7) occurs on the surface of the deposited film, it is considered that, since generated H$_2$O is exhausted from the thin film surface, H$_2$O is difficult to incorporate into the film. However, since the oxygen radical (O*) also reacts with Hf(OH) present in the film, H$_2$O is incorporated into the HfO$_2$ thin film. As a result, as shown in FIG. 14, H$_2$O exists even in the HfO$_2$ thin film formed using the cyclic method, and contamination by mixing of H$_2$O into the film decreases with decreasing film thickness of one cycle subjected to the RPO process.

Figure 15:
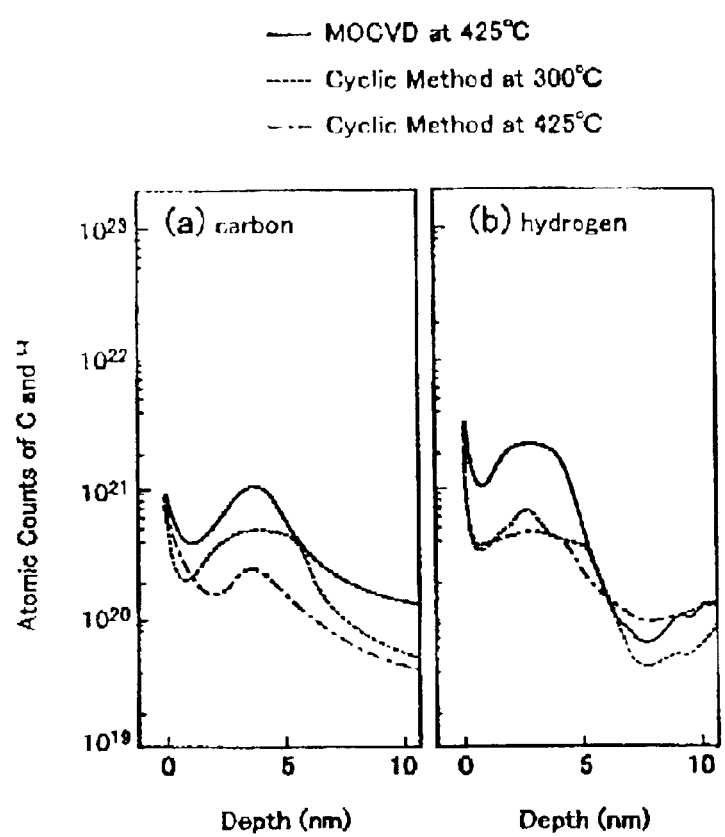
FIG. 15 is a diagram for showing SIMS profiles for (a) carbon and (b) hydrogen in samples formed according to a conventional MOCVD method and a cycle process in an example.

FIG. 15 shows SIMS profiles of carbon ((a) carbon) and hydrogen ((b) hydrogen) of a sample of an HfO$_2$ film formed by the conventional MOCVD method at 425° C. (MOCVD at 425° C.) and samples of an HfO$_2$ film formed by the cyclic method at 300° C. and 425° C. (Cyclic Method at 300° C., 425° C.) The film thickness of these samples is about 5 nm. The samples by the cyclic method at 300° C. and 425° C. were formed by 100 and 10 cycles with a step time of 30 seconds, respectively.

From FIG. 15, the mixing amounts of carbon (C) of the samples by the MOCVD method, the cyclic method at 300° C. and the cyclic method at 425° C. are 1.4, 0.54 and 0.28 at. %, respectively. Moreover, the mixing amounts of hydrogen (H) of the samples by the MOCVD method, the cyclic method at 300° C. and the cyclic method at 425° C. are 2.6, 0.8 and 0.5 at. %, respectively. The result that mixing C and H into the film formed by the cyclic method is lower than that into the film formed by the MOCVD method indicates that the cyclic method has an effect in decreasing the mixing of C and H into the film. According to the report by Kukli et al., the hydrogen mixing amounts in films formed by ALD at 300° C. and 400° C. were 1.5 and 0.5 at. %, respectively. Thereby, it can be understood that, even if compared with ALD, the hydrogen mixing amount into the film formed by the cyclic method is not large to that into the film formed by ALD. The reason why the mixing amount of carbon into the film was decreased is as follows. As shown in the above-described formula (4) and (5), after introduction of Hf-(MMP)$_4$, olefin and H-MMP are generated. In addition, various kinds of alcohols are generated by decomposition of olefin and H-MMP. Although most of such by-products are exhausted from the surface of the thin film, some are adsorped on the thin film surface. Here, such adsorbates are decomposed by the RPO step into CO, CO$_2$, H$_2$O and the like, and then exhausted from the thin film surface by the next purge step. Chen et al. reported that a ZrO$_2$ thin film was formed by a "pulse mode" of, such as, introducing an MO raw material and an oxygen between which exhaustion is interposed for 15 seconds, so that the mixing amount of C into the ZrO$_2$ thin film was 0.1 at. % or less. This is considered to be caused by decomposition of organic materials in the oxygen introduction step and the exhaustion in the subsequent exhaust step. In contrast to the method of Chen et al., the present invention, however, uses a remote plasma oxygen which is more active than an oxygen, so that the present invention has the advantage of having a high efficiency of decomposition of alcohols and the like. Moreover, it can be seen that the impurity amounts of the cyclic method are decreased by raising the film formation temperature. This is because adsorption amounts of by-products decrease as the film formation temperature is raised. For these reasons, it is concluded that, in the cyclic method, it is preferable that the raw material introduction time ΔMt be shorter and the remote plasma introduction time ΔRt be longer. Furthermore, it is concluded that it is preferable that the film formation temperature be higher as long as there is no decomposition of a raw material in gas phase.

Figure 16:
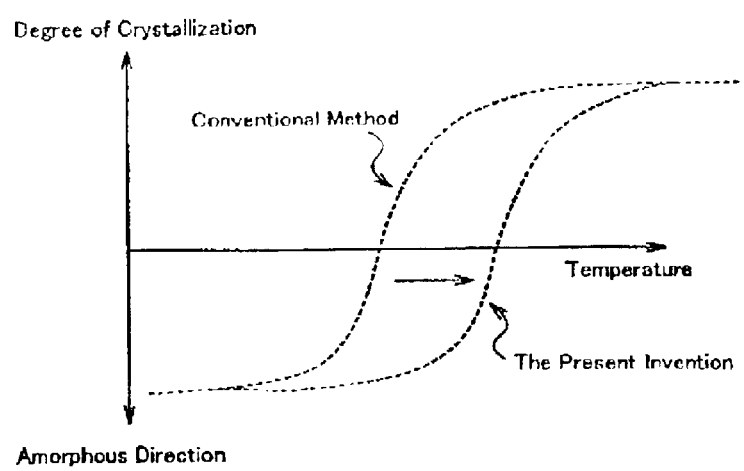
FIG. 16 is a comparison diagram of a conventional example and the present invention for showing temperature dependence property of a degree of crystallization.

Many metal oxides such as an HfO$_2$ film and the like have the property of easily forming a crystallized structure in the film when the temperature raised as shown in FIG. 16. In the conventional MOCVD method, many crystallized portions have been already contained in the film by the deposition at 300° C. or more. In the present invention, however, the crystallization temperature shifts to the high temperature side as indicated in FIG. 16, and it has been found that an HfO$_2$ film which is difficult to crystallize can be obtained. One example of such HfO$_2$ film is indicated by the TEM photograph shown in FIG. 17, and it has been found that the HfO$_2$ film according to the present invention maintains an amorphous structure even at a temperature of crystallization of the conventional HfO$_2$ film.

FIGS. 17(a) and (b) are HRTME images of samples formed by 1 and 4 cycles with step times of 120 seconds and 30 seconds at 425° C., respectively. Before film formation of the HfO$_2$ thin films, an interface layer of 0.8 nm is formed by NH$_3$ annealing. In the TEM images, the portion which looks black is an HfO$_2$ film containing Hf (a heavier atom looks blacker). In general, if a portion has no regularity, the portion is referred to as being amorphous, and if a portion has regularity, the portion is referred to as being crystallized. However, it is considered that, in view of the whole film (general meaning), the film may be referred to as being amorphous even if the film is partially crystallized.

Figure 17:
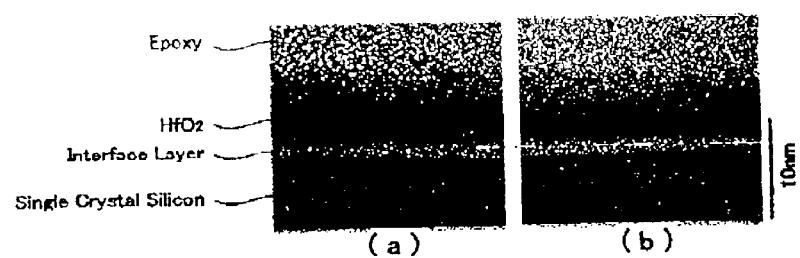
FIG. 17 is a view for showing HRTEM images for samples formed by one cycle and four cycles.

From FIGS. 17(a) and (b), since the interface layers of 1 and 4 cycles are 1.7 nm and 1.6 nm, it is considered that the step times of the RPO process do not affect the formation of the interface layers. In another experiment, however, it is confirmed that the thickness of an undesirable interface layer formed between a base and an HfO$_2$ thin film can be made thinner by the cyclic method than that of the film formation by the conventional MOCVD method. According to FIG. 17, it is understood that the HfO$_2$ thin film formed by 1 cycle is more crystallized while the HfO$_2$ thin film formed by 4 cycles takes on an amorphous structure. Kukli et al. reported that a ZrO$_2$ film formed by ALD took on an amorphous structure at 210° C., and was crystallized at 300° C. Furthermore, Aarik et al. reported that an HfO$_2$ film formed by ALD was crystallized at 300° C. Considering these, it can be concluded that the cyclic method of the present invention is a suitable method to maintain a film in an amorphous structure. In addition, being examined, it could be confirmed that the film thickness uniformity of the film formed by 4 cycles was better than that of the film formed by 1 cycle.

Figure 18:
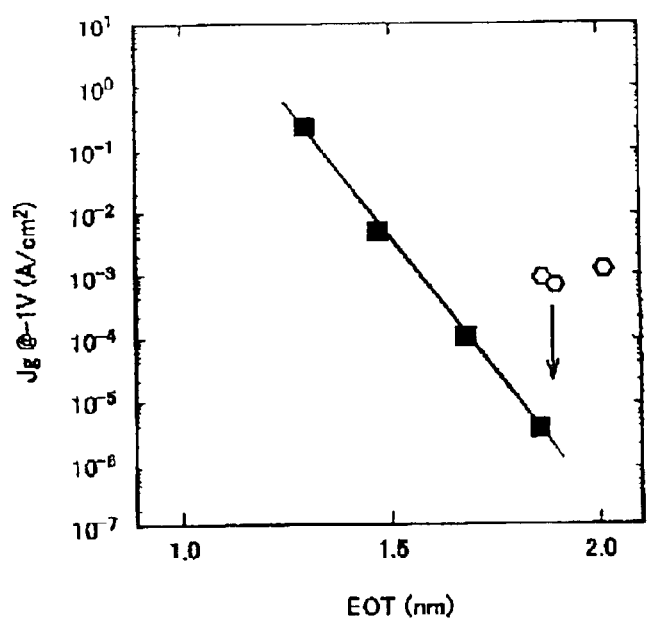
FIG. 18 is a diagram for showing a relation between EOT and a leak current of HfO$_2$ capacitors formed according to a conventional MOCVD method and a cycle process in an example.

FIG. 18 shows a relation between EOT and a leak current measured at −1V of HfO$_2$ capacitors formed at 425° C. according to the conventional MOCVD method and the cyclic method. The ordinate shows the leak current (Jg@−1V), and the abscissa shows an EOT. Before film formation of the HfO$_2$ thin films, an interface layer of 0.8 nm is formed by NH$_3$ annealing. The film thicknesses of the HfO$_2$ thin films formed by the cyclic method are 2.3, 3.1, 3.8 and 4.6 nm, respectively. Of the HfO$_2$ films with different film thickness formed by the MOCVD method, the C-V characteristic was obtained only for the films with a film thickness of 5 nm or more. The unfilled circles and the filled circles indicate the results from the case of film formation by the MOCVD method and the cyclic method, respectively.

In FIG. 18, it can be seen that the leak current of the HfO$_2$ thin film formed by the cyclic method is smaller than or equal to one hundredth of that of the film formed by the MOCVD method. The reason why the leak current was decreased by the cyclic method is that the impurities in the HfO$_2$ film are decreased and the structure of the film is in an amorphous state.

As in the foregoing, the present inventors have found advantages of the new MOCVD method using the cyclic RPO. That is, the present inventors have found that, in the case of the cyclic method, the amounts of impurities contained in a film can be decreased by raising the film formation temperature and by shortening the introduction time of a raw material. Moreover, it has turned out that the film formed by the cyclic method takes on an amorphous structure, and that the cyclic method is desirable to maintain the amorphous structure. As a result, the leak current of the HfO$_2$ film has been decreased. Furthermore, it has turned out that, by the cyclic method, the film thickness uniformity can be improved compared to the film formation by MOCVD, and the thickness of an interface layer formed between a base of the film formation and an HfO$_2$ film can be also made smaller.

According to the present invention, since a metal oxide film is formed without using a gas containing an oxygen atom, during the film-forming step, a specific element in the metal oxide film can be removed effectively so as to make the film easy to modify.

In addition, since a film formation gas and a reactant are supplied through a same supply port, foreign substances which adhere to the inside of the supply port are covered with the thin film, so that the foreign substances can be restrained from falling down on the substrate, and a cleaning gas and by-products which are adsorbed onto the inside of the supply port by cleaning can be removed.

Moreover, in particular, if formation of a film containing Hf and modification of the film using a reactant are successively performed, a specific element in the film containing Hf formed in the film-forming step can be removed rapidly so as to modify the film. In this case, if a film thickness of a film containing Hf which is formed at a time is set to be 0.5 Å–30 Å (a ⅙ atomic layer to ten atomic layers), it is possible to perform the modification process in a state in which the film is difficult to crystallize, and the impurity is effectively removed so as to make it possible to modify the film.

Furthermore, after forming the thin film, an electrode is formed without performing an annealing step as a different step from the electrode formation step, and the steps from the thin film formation to the electrode formation are performed in a same apparatus, so that a throughput can be enhanced.

What is claimed is:

1. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated two or more times, and wherein said metal atom is Hf, and said metal oxide film is a film containing Hf.

2. A method for manufacturing a semiconductor device according to claim 1, wherein said film-forming step and said film-modifying step are performed in a same reaction chamber.

3. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated two or more times, and wherein said raw material is Hf[OC(CH$_3$)$_2$CH$_2$OCH$_3$]$_4$, and said metal oxide film is a film containing Hf.

4. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated two or more times, and wherein said metal atom is Hf, and said metal oxide film is a film containing Hf, and a film thickness of the metal oxide film which is formed in one film-forming step is 0.5 Å–30 Å.

5. A method for manufacturing a semiconductor device according to claim 2, wherein the raw material gas supplied to the substrate in said film-forming step and the reactant supplied to the substrate in said film-modifying step are supplied through a same supply port.

6. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated in a same reaction chamber two or more times, wherein the raw material gas supplied to the substrate in said film-forming step and the reactant supplied to the substrate in said film-modifying step are supplied through different supply ports, respectively, wherein, when the raw material gas is supplied to the substrate through the supply port for the raw material gas in the film-forming step, a nonreactive gas is supplied to the supply port for the reactant, and wherein, when the reactant is supplied to the substrate through the supply port for the reactant in the film-modifying step, a nonreactive gas is supplied to the supply port for the raw material gas.

7. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated in a same reaction chamber two or more times, wherein, when the raw material gas is supplied to the substrate in said film-forming step, the reactant used in the film-modifying step is exhausted without stopping the supply of the reactant such that the reactant bypasses the reaction chamber, and wherein, when the reactant is supplied to the substrate in said film-modifying step, the raw material gas used in the film-forming step is exhausted without stopping the supply of the raw material gas such that the raw material gas bypasses the reaction chamber.

8. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated in a same reaction chamber two or more times, and wherein an exhaust line for exhausting an interior of the reaction chamber in the film-forming step and an exhaust line for exhausting the interior of the reaction chamber in the film-modifying step are provided with a trap for use shared between both the steps.

9. A method for manufacturing a semiconductor device the steps of:

forming a metal oxide film on a substrate using a raw material gas obtained by vaporizing a raw material containing an oxygen atom and a metal atom and without using a gas containing an oxygen atom except said raw material gas;

modifying the metal oxide film which is formed in the film-forming step, using a reactant which is different from said raw material gas, wherein the film-forming step and the film-modifying step are successively repeated in a same reaction chamber two or more times; and a cleaning step, wherein the cleaning step is a step of removing a film which adheres to an inside of the reaction chamber using a cleaning gas which is activated by plasma, wherein the reactant used in the film-modifying step is a gas which is activated by plasma, and wherein a plasma source used for activating the gas in the film-modifying step and a plasma source used for activating the cleaning gas in the cleaning step are one plasma source shared with both the steps.

10. A method for manufacturing a semiconductor device according to claim 1, wherein said reactant contains an oxygen atom.

11. A method for manufacturing a semiconductor device according to claim 1, wherein said reactant comprises a gas obtained by activating a gas containing an oxygen atom by plasma.

12. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein the film-forming step and the film-modifying step are successively repeated two or more times, and wherein said film-forming step and/or said film-modifying step is performed while rotating the substrate.

13. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas;

modifying the metal oxide film which is formed in the film-forming step, using a reactant which is different from said raw material gas, wherein the film-forming step and the film-modifying step are successively repeated in a same reaction chamber two or more times;

transferring the substrate from the reaction chamber via a transfer chamber to a different reaction chamber without exposing the substrate to an ambient atmosphere after forming the metal oxide film on the substrate by repeating the film-forming step and the film-modifying step; and forming in the different reaction chamber an electrode on the metal oxide film formed on the substrate, wherein, after forming the metal oxide film, the electrode is formed without performing an annealing step as a different step from the electrode formation step, and wherein the steps from the metal oxide film formation to the electrode formation are performed in a same apparatus.

14. A method for manufacturing a semiconductor device comprising the steps of:

forming a film containing Hf on a substrate using a raw material gas obtained by vaporizing a raw material containing Hf; and modifying the film containing Hf which is formed in the film-forming step, using a reactant which is different from said raw material gas, wherein the film-forming step and the film-modifying step are successively repeated two or more times.

15. A method for manufacturing a semiconductor device according to claim 14, wherein a film thickness of the film containing Hf which is formed in one film-forming step is 0.5 Å–30 Å.

16. A method for manufacturing a semiconductor device comprising the steps of:

forming a thin film on a substrate by supplying a film formation gas to the substrate;

modifying the thin film which is formed in the film-forming step, by supplying a reactant which is different from said film formation gas;

transferring the substrate from the reaction chamber via a transfer chamber to a different reaction chamber without exposing the substrate to an ambient atmosphere; and forming in the different reaction chamber an electrode on the thin film formed on the substrate, wherein, after forming a thin film on the substrate by successively repeating in a same reaction chamber the film-forming step and the film-modifying step two or more times, the substrate transfer step and the electrode formation step are performed, and wherein, after forming the thin film by repeating the film-forming step and the film-modifying step two or more times, the electrode is formed without performing an annealing step as a different step from the electrode formation step, and wherein the steps from the thin film formation to the electrode formation are performed in a same apparatus.

17. A method for manufacturing a semiconductor device comprising the steps of:

forming a metal oxide film on a substrate using a raw material gas obtained by vaporizing a raw material containing an oxygen atom and a metal atom and without using a gas containing an oxygen atom except said raw material gas; and modifying the metal oxide film which is formed in the film-forming step, using a reactant which is different from said raw material gas, wherein said metal atom is Hf, and said metal oxide film is a film containing Hf.

* * * * *